United States Patent [19]
Yamagata et al.

[11] Patent Number: 5,319,589
[45] Date of Patent: Jun. 7, 1994

[54] DYNAMIC CONTENT ADDRESSABLE MEMORY DEVICE AND A METHOD OF OPERATING THEREOF

[75] Inventors: Tadato Yamagata; Masaaki Mihara; Takeshi Hamamoto; Hideyuki Ozaki, all of Hyogo, Japan

[73] Assignee: Mitsubishi Denki Kabushiki Kaisha, Tokyo, Japan

[21] Appl. No.: 966,921

[22] Filed: Oct. 27, 1992

[30] Foreign Application Priority Data

Apr. 17, 1992 [JP] Japan .................................. 4-097669

[51] Int. Cl.$^5$ ............................................. G11C 15/00
[52] U.S. Cl. .................................... 365/49; 365/222; 365/200
[58] Field of Search ............. 365/49, 222, 200, 189.07

[56] References Cited

U.S. PATENT DOCUMENTS

| | | | |
|---|---|---|---|
| 3,701,980 | 10/1972 | Mundy ...................... | 365/49 |
| 4,965,767 | 10/1990 | Kinoshita et al. .......... | 365/49 |
| 4,975,873 | 12/1990 | Nakabayashi et al. ..... | 365/49 |
| 4,991,136 | 2/1991 | Mihara ...................... | 365/49 |
| 5,130,945 | 7/1992 | Hamamoto et al. ........ | 365/49 |

OTHER PUBLICATIONS

"A 30-kbit Associative Memory LSI for Artificial Intelligence Machines", by Takeshi Ogura et al., IEEE Journal of Solid-State Circuits, vol. 24, No. 4, Aug. 1989, pp. 1014-1020.

"A 288-kbit Fully Parallel Content Addressable Memory Using Stacked Capacitor Cell Structure", by Tadato Yamagata et al., IEEE 1991 Custom Integrated Circuits Conference, pp. 10-13.

"A Bit Line Control Circuit Scheme and Redundancy Technique for High-density Dynamic Content Addressable Memories", by Tadato Yamagata et al., ICD-91-142, pp. 59-66 (Nov. 22, 1991).

*Primary Examiner*—Joseph A. Popek
*Attorney, Agent, or Firm*—Lowe, Price, LeBlanc & Becker

[57] ABSTRACT

A bit line control circuit is disclosed for implementing a dynamic content addressable memory. The bit line control circuit includes a read circuit 12 and a first write circuit 13 connected to data line pairs DT, /DT, a sense amplifier 14, a bit line discharge circuit 15, a bit line charge circuit 16, a transfer gate circuit 17, and a second write circuit 18. The bit line control circuit is connected to a CAM cell array through bit lines BLa, /BLa. Various operations such as write, read, refresh and match detection and the like necessary in the dynamic associative memory can be implemented under simple timing control by a simple circuit configuration.

21 Claims, 17 Drawing Sheets

FIG. 22
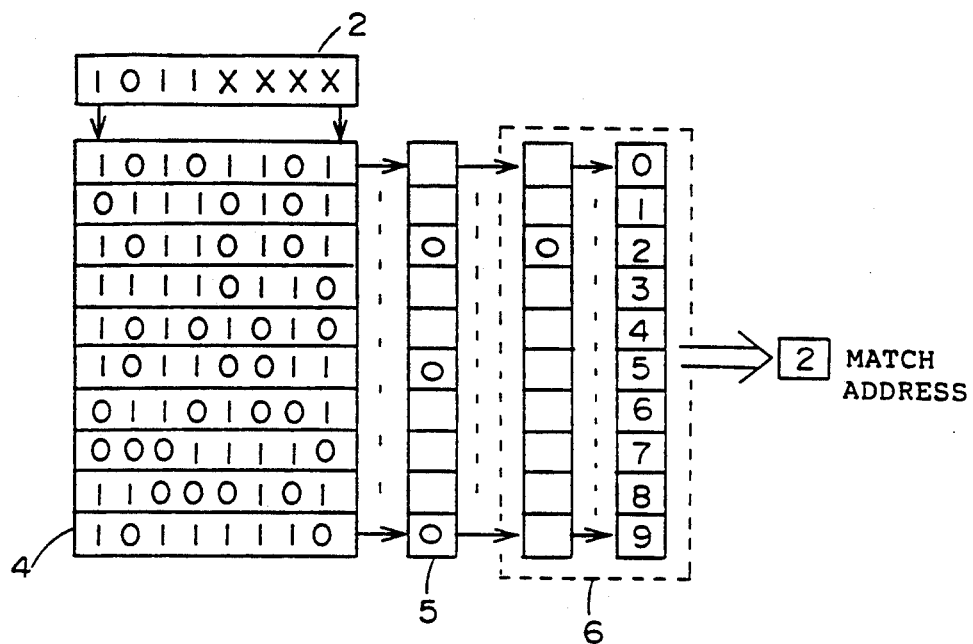
FIG. 23        PRIOR ART
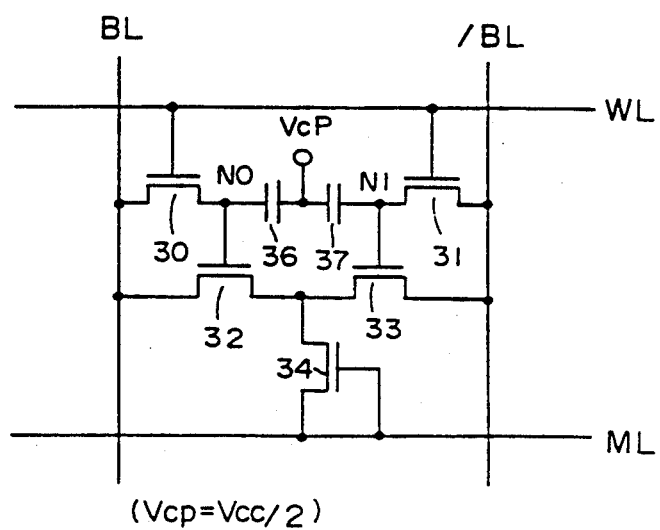

WRITE

READ

MATCH DETECTION

MISMATCH DETECTION

DYNAMIC CONTENT ADDRESSABLE MEMORY DEVICE AND A METHOD OF OPERATING THEREOF

BACKGROUND OF THE INVENTION

1. Field of the Invention

The present invention generally relates to associative memory devices, and more particularly, to an associative memory device having dynamic associative memory cells. The present invention has particular applicability to content addressable memories (CAMs).

2. Description of the Background Art

Retrieval processing of a large amount of data at a high speed has been in greater demand recently. As a functional memory suitable for retrieval processing of a large amount of data, an associative memory called content addressable memory (hereinafter referred to as "CAM") is conventionally known. The CAM detects match between applied retrieval data and stored data to provide an address (referred to as "match address") of the stored data whose match was detected.

Conventionally, a bit serial type CAM, a complete parallel type CAM and the like are known as CAMs. A bit serial type CAM makes comparison of retrieval data with stored data bit by bit. A complete parallel type CAM makes comparison of retrieval data with stored data for all bits in parallel. Therefore, the complete parallel type CAM can carry out a match retrieving operation at the highest speed. In other words, the complete parallel type CAM can operate retrieval processing at a speed which is several hundreds times faster compared to match retrieval processing by conventional software Therefore, the complete parallel type CAM can be applied to various fields such as artificial intelligence, data base system and the like where it is necessary to carry out a match retrieving operation frequently.

However, in order to implement a complete parallel type CAM having practical large storage capacity, some technical problems are left unsolved. One example of the technical problems is that it is difficult to reduce an area occupied by a memory cell on a semiconductor substrate. In other words, since a complete parallel type CAM carries out a match retrieving operation for all bits in parallel between applied retrieval data and stored data, it is necessary for each CAM cell (or each associative memory cell) to include a data storage circuit and a match detecting circuit.

Since a static CAM includes a static latch circuit as a data storage circuit and an EXCLUSIVE NOR circuit as a match detecting circuit, an area occupied by a CAM on a semiconductor substrate is large. Therefore, the storage capacity of a high integration CAM reported so far is at most 20 k bits. In order to reduce the area occupied by the CAM cell on the semiconductor substrate, it is preferable to use a dynamic CAM cell in place of a static CAM cell. The following description is given of a conventionally known dynamic CAM.

A retrieving operation in a CAM will now be described. FIG. 22 is a concept diagram for explaining a retrieving operation in a CAM. For simplicity of description, FIG. 22 shows a CAM cell array 4 of 10-word-by-8-bit configuration. Referring to FIG. 22, the CAM includes the CAM cell array 4, a retrieval data register 2 for applying retrieval data to the CAM cell array 4, a match flag register 5 for retaining a match flag indicative of a retrieval result, and a priority encoder 6.

For example, it is assumed that the memory cell array 4 stores 10-word data shown in FIG. 22. In addition, it is assumed that the retrieval data register 2 applies retrieval data "1011XXXX" to the memory cell array 4. Each "X" indicates that a corresponding bit in the retrieval data is masked. More specifically, less significant four bits of the retrieval data are masked in this example. Therefore, data in the masked less significant four bits don't affect the match detecting result.

Therefore, match is detected between applied retrieval data and each of the third, the sixth and the tenth stored data, and match flags "0" are set in corresponding positions in the match flag register 5, respectively. The match flags are further applied to the priority encoder 6, causing a word of the highest priority of the third, the sixth and the tenth words in this example, that is, the third word having the lowest address in this example to be selected and causing the address "2" thereof to be provided as a match address. It is pointed out that the above-described priority may be determined optionally, although it is predetermined in this example.

FIG. 23 is a schematic diagram of a circuit of a conventional dynamic CAM cell. The circuit shown in FIG. 23 is disclosed in Proceedings of CICC '91, pp. 10–13. Referring to FIG. 23, the dynamic CAM cell includes capacitors 36, 37 for storing data signal electrical charge, NMOS transistors 30, 31 for writing data, NMOS transistors 32, 33 for configuring an EXCLUSIVE NOR circuit, and an NMOS transistor 34 operating as a diode. The data signal electrical charge is stored by the capacitors 36 and 37 and gate capacitance of the transistors 32 and 33. A cell plate voltage Vcp (=Vcc/2) is applied to one electrode of the capacitors 36 and 37. The gates of the transistors 30 and 31 are connected to a word line WL. One electrode of the transistors 30 and 32 is connected to a bit line BL. One electrode of the transistors 31 and 33 is connected to a bit line /BL. One electrode and the gate of the transistor 34 are connected to a match line ML.

FIGS. 24A and 24B are schematic diagrams of circuits for explaining write and read operations in the dynamic CAM cell. FIGS. 25A and 25B are schematic diagrams of circuits for explaining a match detecting operation. Referring to FIGS. 24A, 24B, 25A and 25B, description will be given below of operations of the dynamic CAM cell.

Referring to FIG. 24A, the write operation is carried out as in the following. First, the bit lines BL, /BL are brought to potentials inverted to each other in response to a data signal to be written. Since the word line WL is activated, the potentials of the bit lines BL, /BL are applied to the capacitors 36, 37 through the transistors 30, 31, respectively. The word line WL attains a low level, and the transistors 30 and 31 are turned off, causing the data signal electrical charge to be retained by the capacitors 36 and 37. The potential of the match line ML is maintained at a low level during the write operation.

Referring to FIG. 24B, the read operation is carried out as in the following. First, a bit line pair BL, /BL is discharged, and a high level potential is applied to the match line ML. For example, assuming that the CAM cell stores the data signal shown in FIG. 24B, the transistor 32 is turned on, while the transistor 33 is turned off. Therefore, the bit line BL is caused to be connected to the match line ML through the transistors 32 and 34, resulting in a high level of the potential of the bit line BL. On the other hand, the potential of the bit line /BL is retained at a low level. During the above-described read operation, the word line WL is not activated.

Referring to FIG. 25A, the match detecting operation is carried out as in the following. First, the bit lines BL, /BL and the match line ML are precharged to a high level potential. As one example, it is assumed that data shown in FIG. 25A is stored in the CAM cell, and that retrieval data is applied to the bit lines BL, /BL. More specifically, since match is detected between the stored data and the retrieval data in this case, neither the transistor 32 nor the transistor 33 is turned on, and the potential of the match line ML is remained at a high level.

Conversely, when an inverted retrieval data signal is applied to the bit lines BL, /BL, mismatch is detected between the retrieval data and the stored data. In other words, as shown in FIG. 25B, the transistor 32 is turned on, and the transistor 33 is turned off. Therefore, the match line ML is discharged through the transistors 32 and 34, resulting in attaining a low level. As described above, after applying a retrieval data signal to the bit lines BL, /BL, "match" or "mismatch" may be detected between the retrieval data and the stored data by detecting potential change of the match line ML.

A conventional static CAM cell, not shown, uses a latch circuit for storing data. On the other hand, a dynamic CAM cell includes two capacitors 36 and 37 for storing data as shown in FIG. 23. By using two capacitors 36 and 37 for storing data in place of a latch circuit, the dynamic CAM cell, compared to the static CAM cell, is reduced in the number of necessary elements, and it is, therefore, suitable for high integration of the CAM.

However, a circuit necessary for accessing such a dynamic CAM cell has not been proposed yet, although a circuit of the dynamic CAM cell shown in FIG. 23 has been conventionally known. A different circuit from the static CAM cell using a latch circuit is needed especially because of employment of the two capacitors 36, 37 for storing data.

For example, a periodical refresh operation is needed to prevent stored data from being lost by leakage of electrical charge from the two capacitors 36, 37 which store data signals. Therefore, a refresh circuit which is not provided in the static CAM is needed. However, it has not been known specifically what type of circuit is suitable for the dynamic CAM. In particular, since the dynamic CAM, compared to a general dynamic RAM conventionally known, carried out complicated operations such as a match detecting operation, for example, it was generally difficult to implement a peripheral circuit of the dynamic CAM cell in a simplified circuit configuration.

Enhancement of the yield rate in production which is expected as high integration of the CAM must be taken into consideration. More specifically, although a redundancy circuit for use in a dynamic RAM has been conventionally known, a practical circuit configuration for redundancy use in a dynamic CAM has not been known. Therefore, in order to prevent lowering of the yield rate with high integration of the CAM in the near future, a practical and effective redundancy circuit has been desired.

SUMMARY OF THE INVENTION

One object of the present invention is to provide a dynamic content addressable memory device.

Another object of the present invention is to implement a dynamic content addressable memory device by a simplified circuit configuration.

Still another object of the present invention is to provide a dynamic content addressable memory device operating under simplified control.

A further object of the present invention is to improve the yield rate in production of dynamic content addressable memory devices.

Briefly, the dynamic content addressable memory device according to the present invention includes a plurality of dynamic associative memory cells arranged in rows and columns, a plurality of bit line pairs each connected to associative memory cells in a corresponding column, a plurality of data line pairs respectively connected to the plurality of bit line pairs, a plurality of word lines each connected to associative memory cells in a corresponding row, a plurality of match detecting lines each connected to associative memory cells in a corresponding row, a plurality of bit line pair driving circuits each connected to a corresponding bit line pair and responsive to a signal on a corresponding data line pair for driving the corresponding bit line pair, a plurality of sense amplifiers each connected to a corresponding bit line pair and responsive to a sense amplifier activating signal for amplifying a data signal on the corresponding bit line pair, and a plurality of data line pair driving circuits each connected to a corresponding bit line pair and responsive to a signal on a corresponding bit line pair for driving a corresponding data line pair.

In operations, since the plurality of bit line pair driving circuits, the plurality of sense amplifiers and the plurality of data line pair driving circuits are respectively connected to the plurality of bit line pairs, read, write and refresh operations necessary in a dynamic content addressable memory device can be implemented in a simple circuit configuration.

According to another aspect of the present invention, the dynamic content addressable memory device includes a plurality of associative memory cells arranged in rows and columns, a plurality of bit line pairs each connected to associative memory cells in a corresponding column, a plurality of match detecting lines each connected to an associative memory cells in a corresponding row, a plurality of bit line pair driving circuits each connected to a corresponding bit line pair and responsive to an applied comparison data signal for driving the corresponding bit line pair, and a match detecting line charge circuit for charging the plurality of match detecting lines to a predetermined potential. Each associative memory cell includes a capacitor for storing a data signal, and a comparating circuit for comparing a comparison data signal applied through a corresponding bit line pair with the data signal stored by the capacitor to change a potential of a corresponding match detecting line.

In operations, the plurality of bit line driving circuits are respectively connected to the plurality of bit line pairs, and the match detecting line charge circuit is provided for charging the plurality of match detecting lines. Therefore, a match detecting operation necessary in the dynamic content addressable memory device can be implemented in a simple circuit configuration.

According to still another aspect of the present invention, the dynamic content addressable memory device includes a plurality of associative memory cells arranged in rows and columns, a plurality of bit line pairs each connected to associative memory cells in a corresponding column, a plurality of word lines each connected to associative memory cells in a corresponding row, a plurality of match detecting lines each connected to associative memory cells in a corresponding row, and a plurality of amplifiers each connected to a corresponding bit line pair for amplifying a data signal on the corresponding bit line pair. Each associative memory cell includes a capacitor for storing a data signal, a first switching circuit responsive to a signal on a corresponding word line for providing a data signal on a corresponding bit line pair to the capacitor, and a second switching circuit responsive to a signal on a corresponding match detecting line for applying the data signal stored by the capacitor to a corresponding bit line pair. The dynamic content addressable memory device further includes a refresh control circuit responsive to a refresh instructing signal for activating a match detecting line selected by an address signal, amplifiers and a word line selected by the address signal in this order.

In operations, the plurality of amplifiers are respectively connected to the plurality of bit line pairs, and the refresh control circuit is provided for activating the match detecting line, the amplifiers and the word line in this order in response to the refresh instructing signal. Therefore, a refresh operation necessary in the dynamic content addressable memory device can be implemented in a simple circuit configuration.

According to a further aspect of the present invention, the dynamic content addressable memory device includes a plurality of dynamic associative memory cells arranged in rows and columns, a plurality of bit line pairs each connected to associative memory cells in a corresponding column, a plurality of data line pairs respectively connected to the plurality of bit line pairs a plurality of word lines each connected to associative memory cells in a corresponding row, a plurality of match detecting lines each connected to associative memory cells in a corresponding row, a plurality of bit line pair driving circuits each connected to a corresponding bit line pair and responsive to a signal on a corresponding data line pair for driving the corresponding bit line pair, a plurality of sense amplifiers each connected to a corresponding bit line pair and responsive to a sense amplifier activating signal for amplifying a data signal on the corresponding bit line pair, and a plurality of data line pair driving circuits each connected to a corresponding bit line pair and responsive to a signal on the corresponding bit line pair for driving a corresponding data line pair. The plurality of bit line pairs include a predetermined redundancy bit line pair for redundancy use. The dynamic content addressable memory device further includes a redundancy access disable circuit connected to the redundancy bit line pair for disabling access to associative memory cells connected to the redundancy bit line pair in a normal access state, a plurality of normal access disable circuits each connected to a corresponding bit line pair except for a redundancy bit line pair for selectively disabling access to associative memory cells connected to the corresponding bit line pair when a defect is generated, and a redundancy disable releasing element for releasing disable function by the redundancy disable circuit when a defect is generated.

In operations, in the normal access state, the redundancy access disable circuit disables access to memory cells connected to the redundancy bit line pair. The redundancy disable releasing element releases disable function by the redundancy access enable circuit when a defect is generated. Therefore, it is possible to improve the yield rate in production of dynamic content addressable memory devices.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 is a concept diagram for explaining a retrieval operation in the CAM.

FIG. 23 is a schematic diagram of a circuit of a conventional dynamic CAM cell.

DESCRIPTION OF THE PREFERRED EMBODIMENTS

Figure 1:
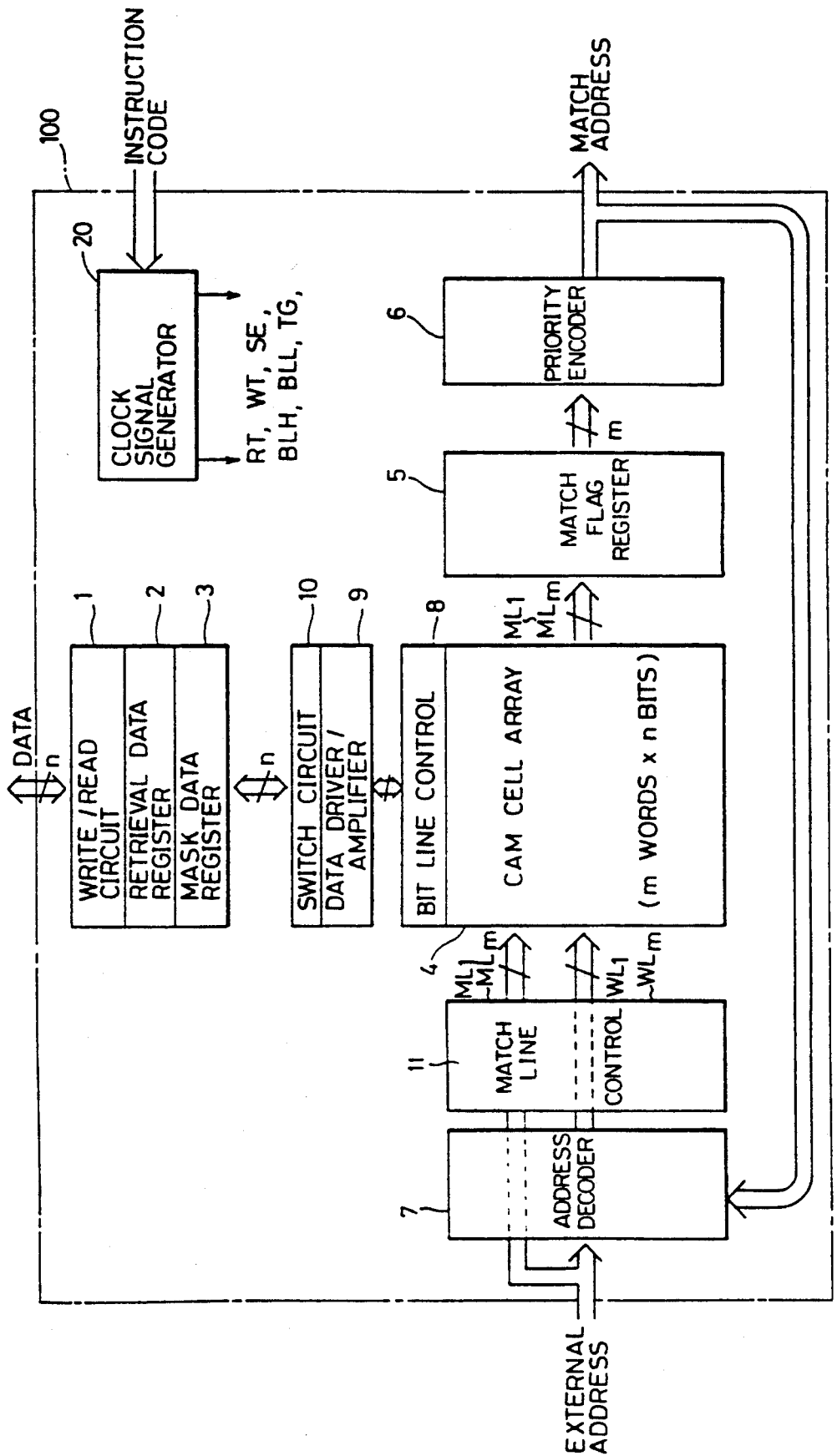
FIG. 1 is a block diagram of a dynamic CAM showing one example of the present invention.

Referring to FIG. 1, a dynamic CAM 100 includes a CAM cell array 4 having a circuit configuration of m words x n bits, and a bit line control circuit 8 for controlling potentials of bit lines (not shown) in the CAM cell array 4. An address decoder 7 decodes an external address to selectively activate one of m word lines, not shown. A match flag register 5 retains a match flag indicative of a retrieval result provided from the CAM cell array 4. A priority encoder 6 receives the match flag provided from the match flag register 5 to provide a match address determined in accordance with a predetermined priority.

The dynamic CAM 100 further includes a write/read circuit 1 for input/output of data, a retrieval data register 2 for temporarily retaining retrieval data, a mask data register 3, a switch circuit 10, a data driver/amplifier 9, and a clock signal generator 20 for decoding an externally applied instruction code to generate various clock signals. Control signals or clock signals RT, WT, SE, BLH, BLL, TG and the like necessary in circuit operations described below are generated by the clock signal generator 20 by decoding the instruction code. It is pointed out that the retrieval data register 2, the CAM cell array 4, the match flag register 5 and the priority encoder 6 correspond to the circuit configuration shown in FIG. 22 and that have the similar function.

In a retrieval operation, first, n-bit retrieval data is applied to the retrieval data register 2 through the write/read circuit 1. The retrieval data retained in the retrieval data register 2 is applied to the CAM cell array 4 through the mask data register 3, the switch circuit 10, the data driver/amplifier 9 and the bit line control circuit 8. The match retrieval operation is carried out in the CAM cell array 4, and a match flag indicative of a match retrieval result it applied to the match flag register 5. The priority encoder 6 receives the match flag through the match flag register 5. When the match flag indicative of a plurality of word lines is applied, the priority encoder 6 determines one word of the plurality of words in accordance with a predetermined priority. The address of the determined word is encoded in the priority encoder 6 to be provided as a match address.

The match address provided from the priority address encoder 6 is also applied to the address decoder 7 if necessary. As a result, writing or reading of data may be carried out with regard to the CAM cells of a word in the CAM cell array 4 where match is detected The mask data register 3 masks part of n-bit retrieval data if necessary, and in some cases, the mask data register 3 retains a mask control bit or bits for rewriting only a desired bit or bits of n-bit data.

Figure 2:
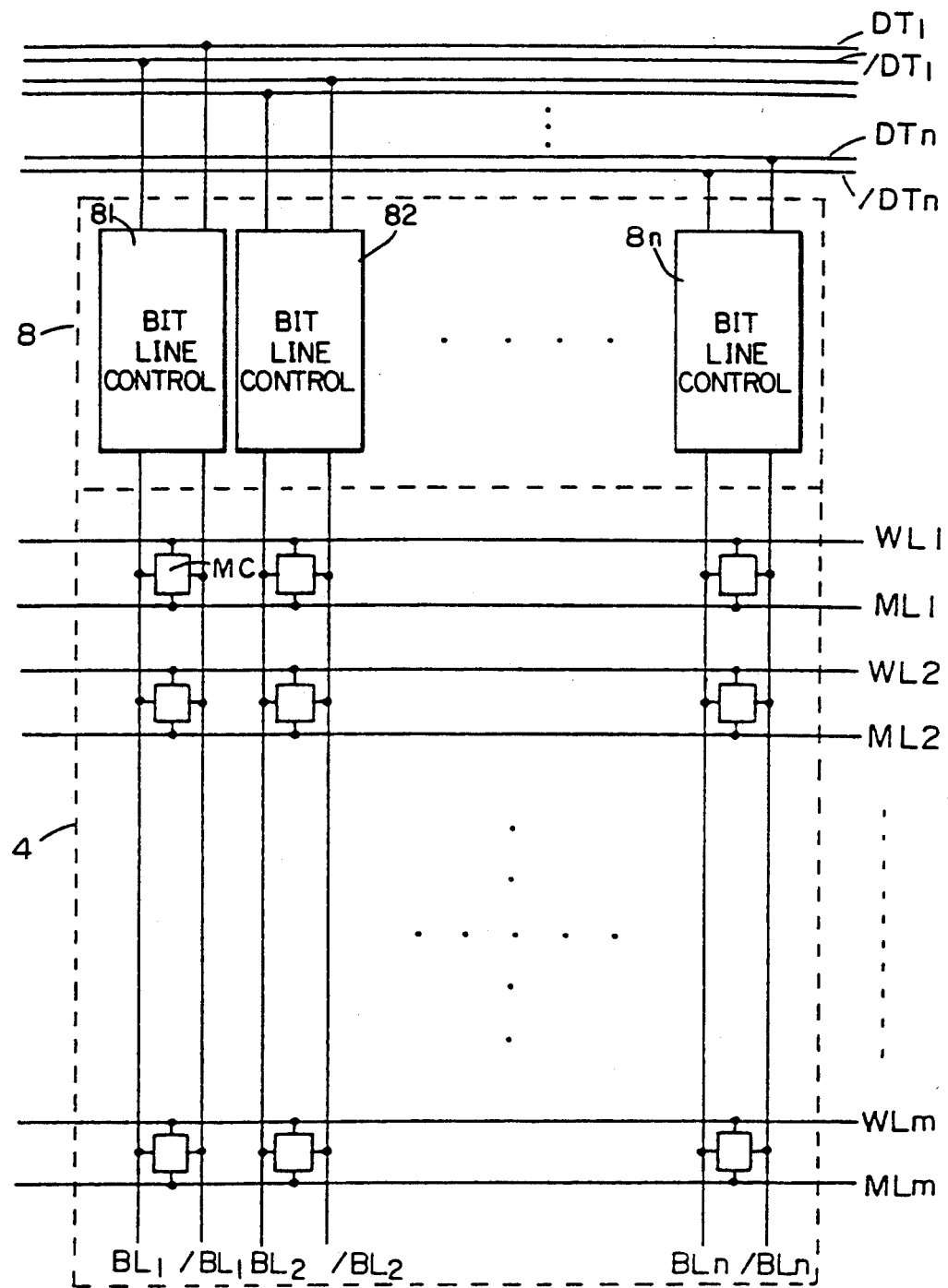
FIG. 2 is a circuit block diagram of the memory array and the bit line control circuit shown in FIG. 1.

FIG. 2 is a circuit block diagram of the CAM cell array 4 and the bit line control circuit 8 shown in FIG. 1. Referring to FIG. 2, the CAM cell array 4 includes a plurality of dynamic CAM cells MC arranged in rows and columns, a plurality of bit line pairs BL1, /BL1 to BLn, /BLn each connected to a CAM cell in a corresponding column, a plurality of word lines WL1 to WLm each connected to a CAM cell in a corresponding row, and a plurality of match lines ML1 to MLm each connected to a CAM cell in a corresponding row. Each CAM cell has a circuit configuration shown in FIG. 23. The match lines ML1 to MLm are connected to the match flag register 5 and a match line control circuit 11 shown in FIG. 1.

The bit line control circuit 8 includes n bit line control circuits 8l to 8n each connected to a corresponding one of bit line pairs BL1, /BL1 to BLn, /BLn. The bit line control circuits 8l to 8n are connected to data line pairs DT1, /DT1 to DTn, /DTn, respectively. Description will be given in detail of the bit line control circuits 8l to 8n hereinafter.

Figure 3:
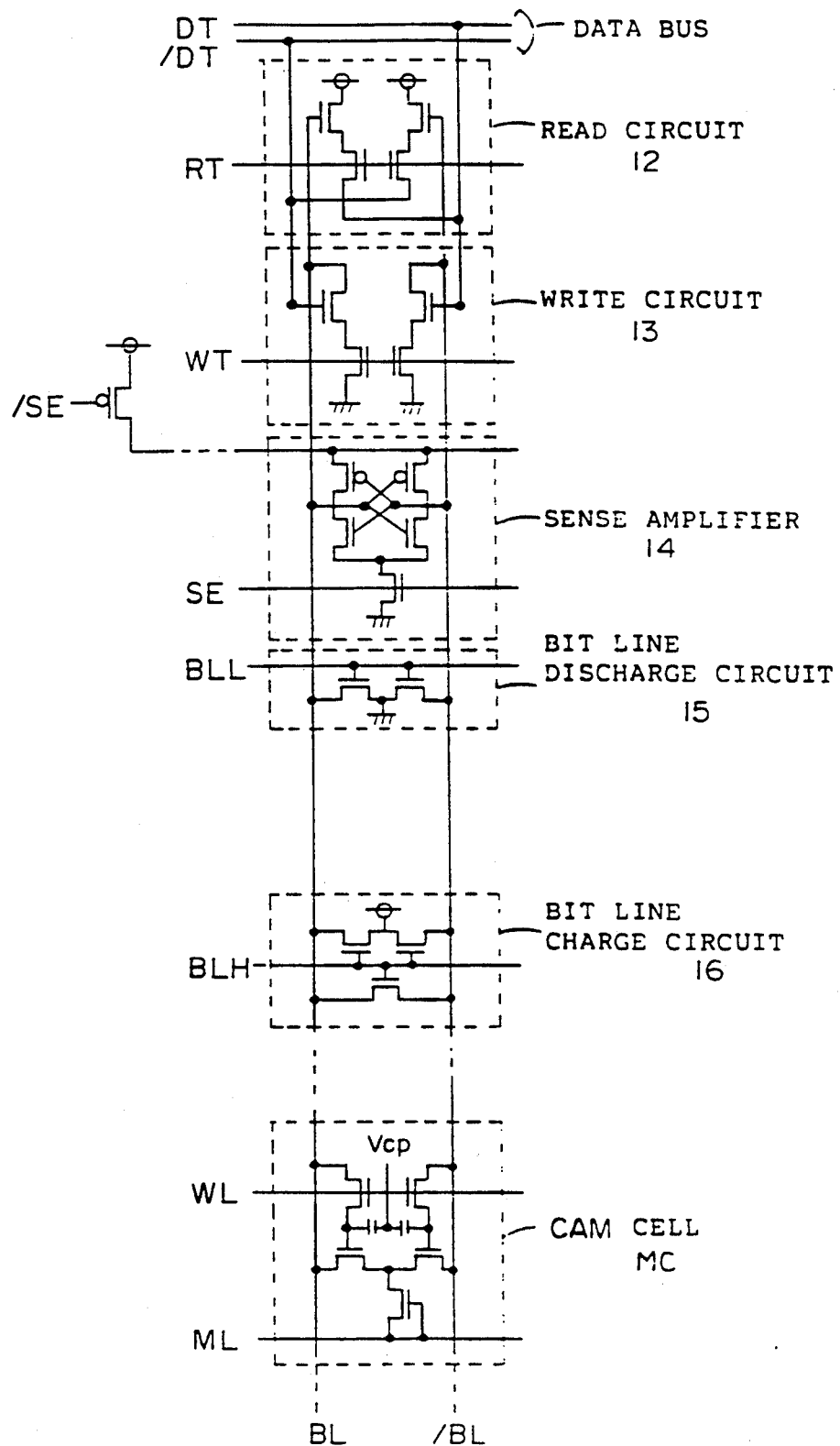
FIG. 3 is a schematic diagram of a bit line control circuit shown in FIG. 2.

FIG. 3 is a schematic diagram of a bit line control circuit shown in FIG. 2. Referring to FIG. 3, the bit line control circuit includes a read circuit 12, a write circuit 13, a sense amplifier 14, a bit line discharge circuit 15 and a bit line charge circuit 16 connected to a bit line pair BL, /BL, respectively. For reference, a CAM cell connected to the bit line pair BL, /BL is shown. The read circuit 12 and the write circuit 13 are connected to the data line pair DT, /DT configuring a data bus.

The read circuit 12 is enabled in response to a read enable signal RT and drives the data line pair DT, /DT in response to a signal on the bit line pair BL, /BL. On the other hand, the write circuit 13 is enabled in response to a write enable signal WT, and drives the bit line pair BL, /BL in response to a signal on the data line pair DT, /DT.

The sense amplifier 14 is activated in response to sense amplifier activating signals SE and /SE to amplify a potential difference between the bit lines BL, /BL. The bit line discharge circuit 15 discharges the bit line pair BL, /BL in response to a discharge control signal BLL. On the other hand, the bit line charge circuit 16 charges the bit line pair BL, /BL in response to a charge control signal BLH.

Figure 4:
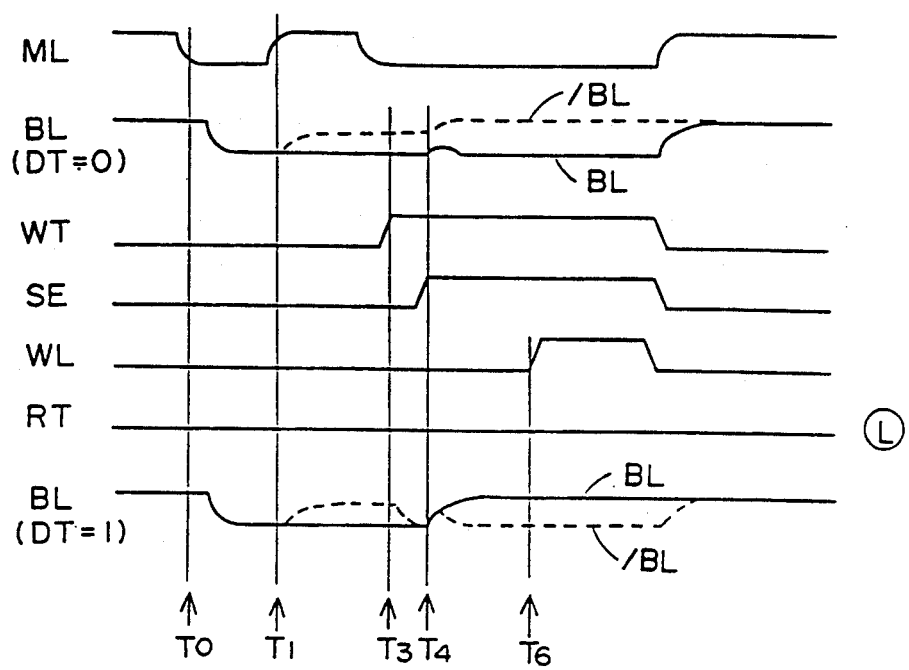
FIG. 4 is a timing chart for explaining a write operation of the bit line control circuit shown in FIG. 3.

Operations of the bit line control circuit shown in FIG. 3 will be described hereinafter referring to a timing chart. Referring to FIG. 4, a write operation to the CAM cell is carried out as in the following. First, in a standby state, the match line control circuit 11 shown in FIG. 1 brings the potential of the match line ML to a high level. In addition to this, the bit line charge circuit 16 is activated in response to the high level signal BLH, causing the bit line pair BL, /BL to be charged to a high level.

At time T0, the match line control circuit 11 renders the potential of all the match lines ML to be a low level, and activation of the bit line charge circuit 16 is completed in response to rise of the signal BLH. In addition, the bit line discharge circuit 15 is enabled in response to rise of the signal BLL, and the bit line pair BL, /BL is discharged.

At time T1, the match line control circuit 11 activates a match line ML selected by an external address signal. In response to activation of the match line ML, a potential difference based on the stored data signal appears on the bit lines BL or /BL.

A data drive/amplifier circuit 9 shown in FIG. 1 applies a write data signal to the data line pair DT, /DT in response to externally applied data. At time T3, the write enable signal WT is activated and the write circuit 13 is enabled. The write circuit 13 drives the bit line pair BL, /BL in response to the write data signal on the data line pair DT, /DT. In other words, the write circuit 13 selectively pulls down one of the bit lines BL and /BL in response to a data signal to be written.

When a data signal stored in the CAM cell matches the data signal on the data lines DT, /DT, the potential of the bit line BL (DT=0) little changes after time T3, as shown in FIG. 4. On the other hand, when a stored data signal does not match the write data signal, the bit line pair BL, /BL are discharged through a discharge path in the write circuit 13 formed by activation of the write enable signal WT to be brought to a ground potential.

At time T4, the sense amplifier 14 is activated in response to the sense amplifier activating signals SE and /SE. Since one of the bit lines BL, /BL has been brought to the ground potential in response to the write data signal by time T4, an amplified write data signal is applied onto the bit lines BL, /BL after activation of the sense amplifier 14.

At time T6, since the address decoder 7 shown in FIG. 1 activates the word line WL selected by external address signal, a data signal on the bit line pair BL, /BL is written in the CAM cell. During the above-described write operation, the read enable signal RT is maintained at a low level.

Figure 5:
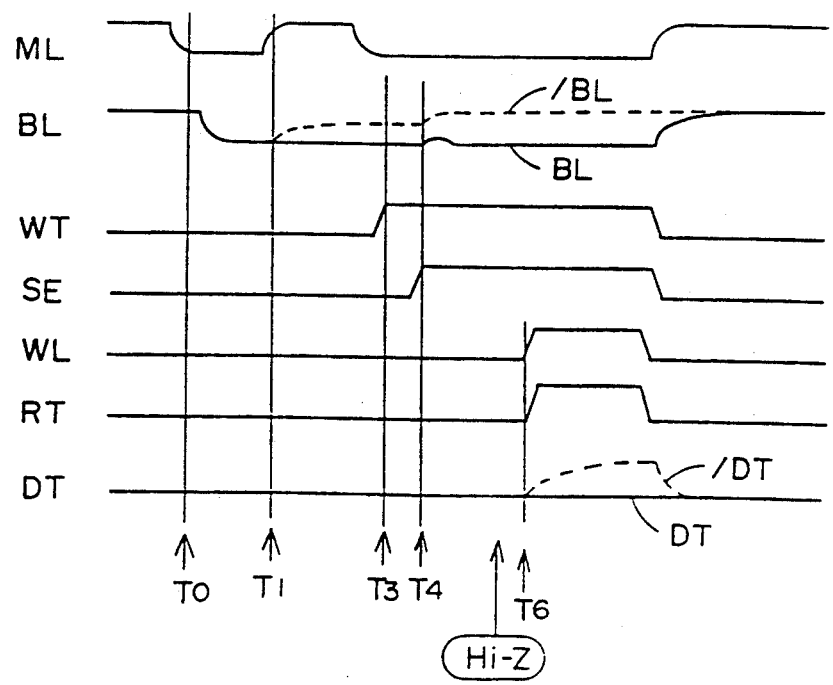
FIG. 5 is a timing chart for explaining a read operation of the bit line control circuit shown in FIG. 3.

Referring to FIG. 5, a read operation will now be described. In the read operation, the data driver/amplifier circuit 9 shown in FIG. 1 applies the ground potential to the data line pair DT, /DT. As a result, since the write circuit 13 is not activated regardless of the potential of the write enable signal WT, the discharge path of the bit lines BL, /BL is not formed. This means that the read operation of data stored in the CAM cell may be carried out by applying the similar control signal as in the read operation shown in FIG. 4 with the data line pair DT, /DT retained at the ground potential.

Therefore, as shown in FIG. 5, the same control signals ML, WT and SE as in the write operation are applied, and the data line pair DT, /DT are retained at the ground potential until immediately before time T6. After the data line pair DT, /DT are brought to a high impedance state (Hi-Z) immediately before time T6, the read enable signal RT is activated at time T6. The read circuit 12 activates the data line pair DT, /DT in response to a signal on the bit line pair BL, /BL, whereby the data signal stored in the CAM cell is meant to have been applied onto the data line pair DT, /DT.

Figure 6:
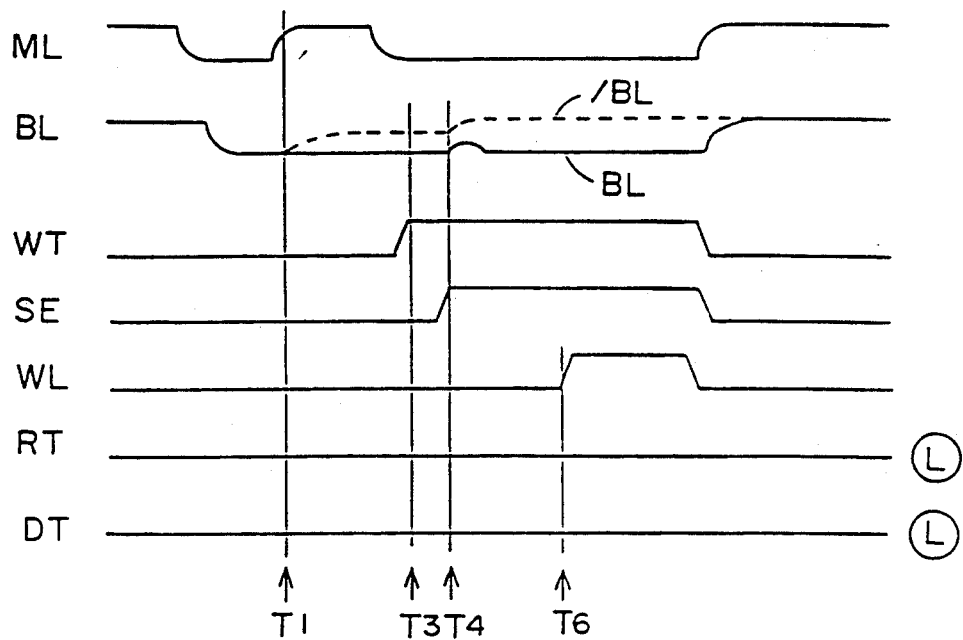
FIG. 6 is a timing chart for explaining a refresh operation of the bit line control circuit shown in FIG. 3.

Referring to FIG. 6, a refresh operation will now be described. Also in the refresh operation, with the data line pair DT, /DT retained at the ground potential, the same control signals ML, WT, SE and WL as the write operation shown in FIG. 4 are applied. Therefore, the data signal stored in the CAM cell is read onto the bit line pair BL, /BL to be amplified by the sense amplifier 14. The amplified data signal is written to the same CAM cell again.

It is pointed out that the above-described refresh operation may be applied to a partial write operation. In other words, after selectively retaining at the ground potential the data line pair DT, /DT connected to CAM cells storing data not to be rewritten, that is, to be retained, of n-bit data configuring one word, a control signal shown in FIG. 6 is applied. A data signal stored in the CAM cell connected to the data line pair DT, /DT retained at the ground potential is refreshed only and not rewritten to different data. CAM cells connected to the other bit pairs are rewritten in accordance with data signals applied to respective data line pairs from the circuit 9 shown in FIG. 1. In other words, the refresh operation can be said to be the partial write operation in a manner with all of n bits masked.

Figure 7:
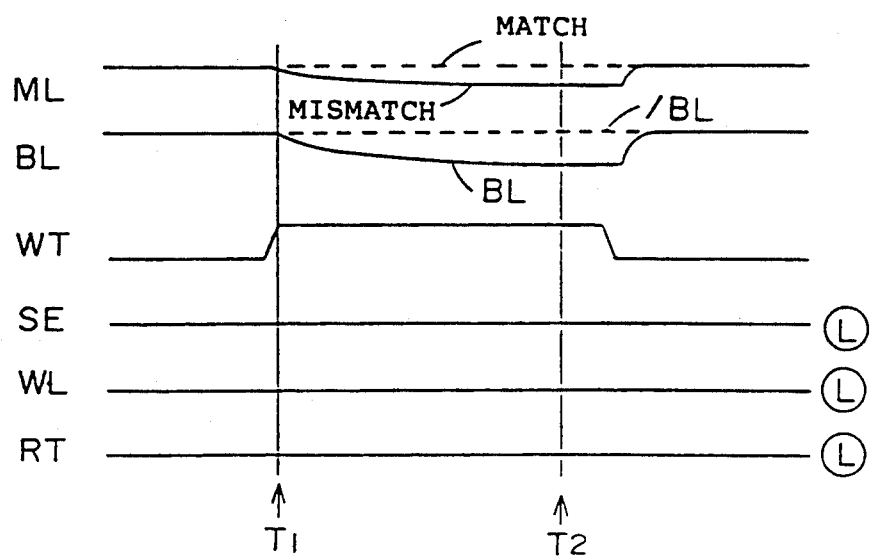
FIG. 7 is a timing chart for explaining a match detecting operation of the bit line control circuit shown in FIG. 3.
Figure 25A:
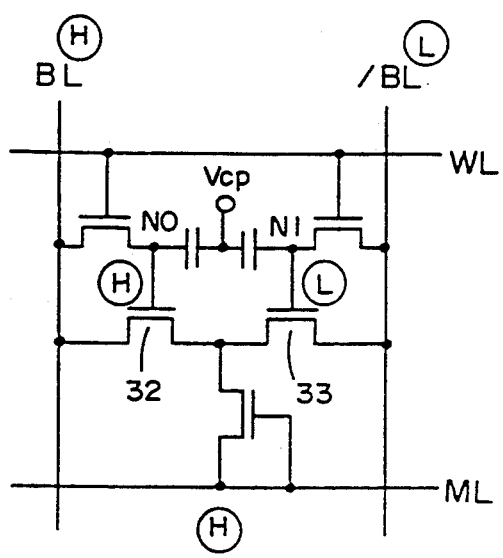
FIGS. 25A and 25B are schematic diagram of circuits for explaining a match detecting operation in a dynamic CAM cell.
Figure 25B:
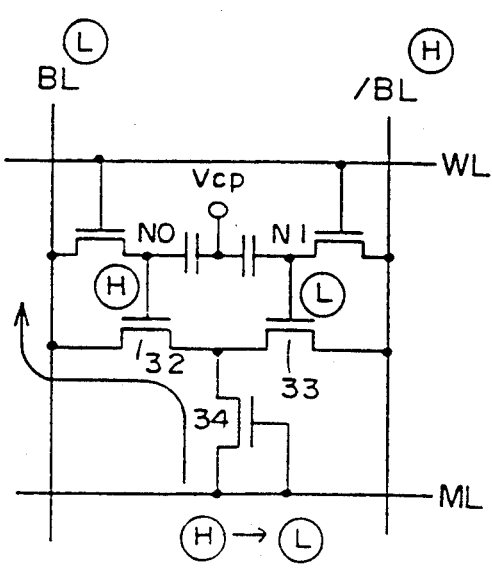

Referring to FIG. 7, a match detecting operation will now be described. First, the match line control circuit 11 shown in FIG. 1 precharges the match line ML in response to an externally applied address signal. At time T1, the write enable signal WT is activated. In response to rise of the signal WT, the write circuit 13 is enabled. The write circuit drives the bit line pair BL, /BL in response to a retrieval data signal on the data line pair DT, /DT. Therefore, the retrieval data signal is transmitted to the CAM cell through the bit line pair BL, /BL. The match detecting operation shown in FIG. 25A or 25B is carried out in the CAM cell, and the potential of the precharged match line ML is changed in response to a match detecting result. The potential of the match line ML is amplified by an amplifying circuit, not shown, at time T2.

On the other hand, when a mask retrieval operation is carried out, a data line pair corresponding to a bit which should not be considered in the retrieval operation is maintained to be the ground potential. As a result, the discharge path of the bit lines BL, /BL is not formed in the write circuit 13, whereby the bit line pair of the masked retrieval data is retained at a high level during the match detecting operation. Therefore, the CAM cell to which a masked retrieval data signal is applied does not discharge the match line ML independent of a stored data signal. In other words, as for the masked bit, even if what data signals are stored in the CAM cell, it is regarded that "match" was detected.

As can be seen from timing charts of FIGS. 4 to 7, it is pointed out that substantially the same control signals are applied in any of write, read, refresh and match detecting operations in the dynamic CAM. In addition to this, substantially the same control signals are also used in the mask retrieval operation and the partial write operation. More specifically, a practical and effective dynamic CAM can be provided by using a bit line control circuit shown in FIG. 3 without requiring special timing control in order to carry out various operations in the dynamic CAM.

Figure 8:
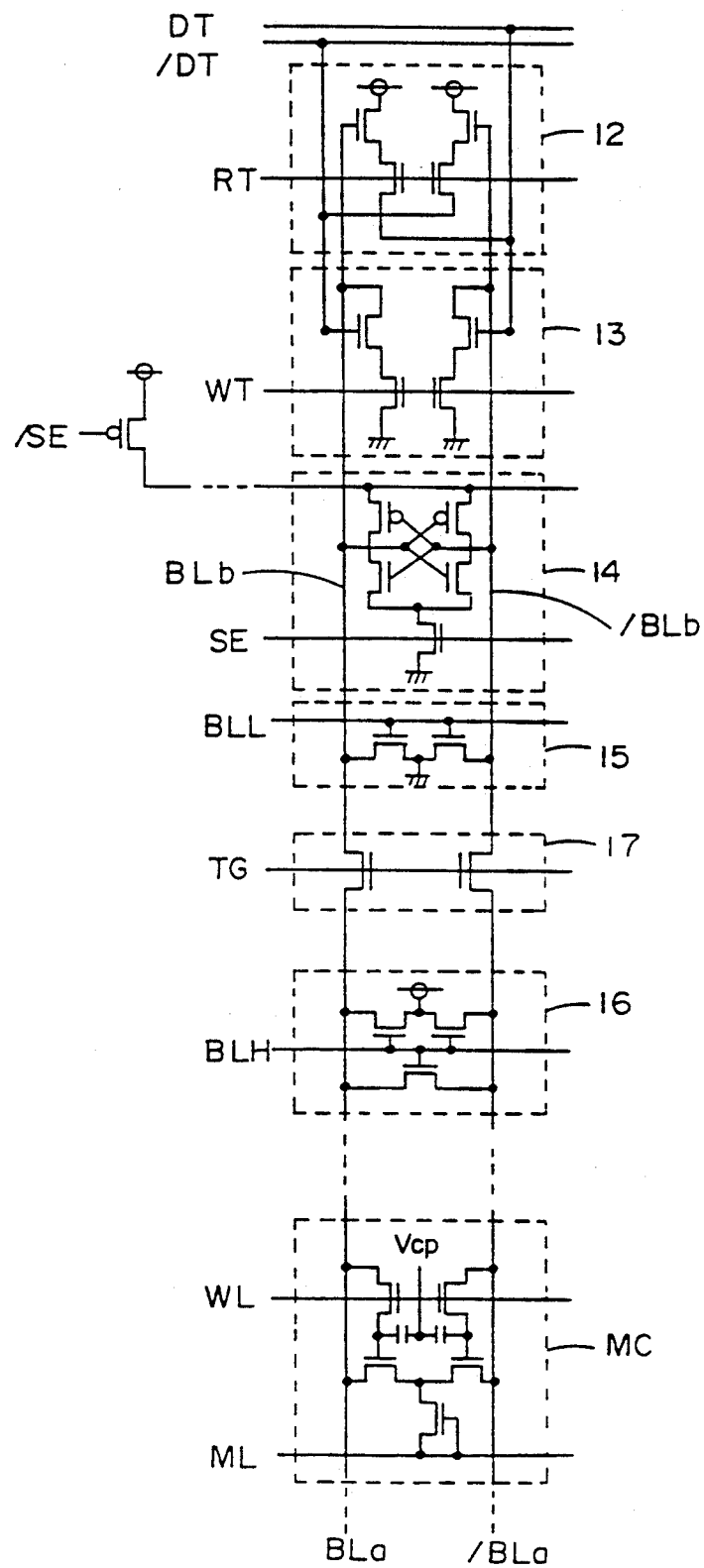
FIG. 8 is a schematic diagram of a bit line control circuit showing another embodiment of the present invention.

FIG. 8 is a schematic diagram of a bit line control circuit showing another embodiment of the present invention. Compared to the circuit shown in FIG. 3, the bit line control circuit shown in FIG. 8 further includes a transfer gate circuit 17 for promoting an amplifying operation by the sense amplifier 14. The transfer gate circuit 17 is provided on a bit line between the bit line discharge circuit 15 and the bit line charge circuit 16. When the sense amplifier 14 is activated, the transfer gate circuit 17 is turned off in response to a low level control signal TG. As a result, since bit lines BLa, /BLa connected to the CAM cell array is electrically separated from the sense amplifier 14 by function of the transfer gate circuit 17, a load to be amplified by the sense amplifier 14 can be reduced. Therefore, a high speed amplification by the sense amplifier 14 can be achieved.

FIGS. 9 to 12 are timing charts for explaining a write operation, a read operation, a refresh operation and a match detecting operation of the bit line control circuit shown in FIG. 8, respectively. As can be seen from these timing charts, basic operations in the bit line control circuit shown in FIG. 8 are the same as those in the bit line control circuit shown in FIG. 3. However, as can be seen from comparison with timing charts shown in FIGS. 4 to 7, the timing charts shown in FIGS. 9 to 12 include a newly added control signal TG for the transfer gate circuit 17.

Figure 9:
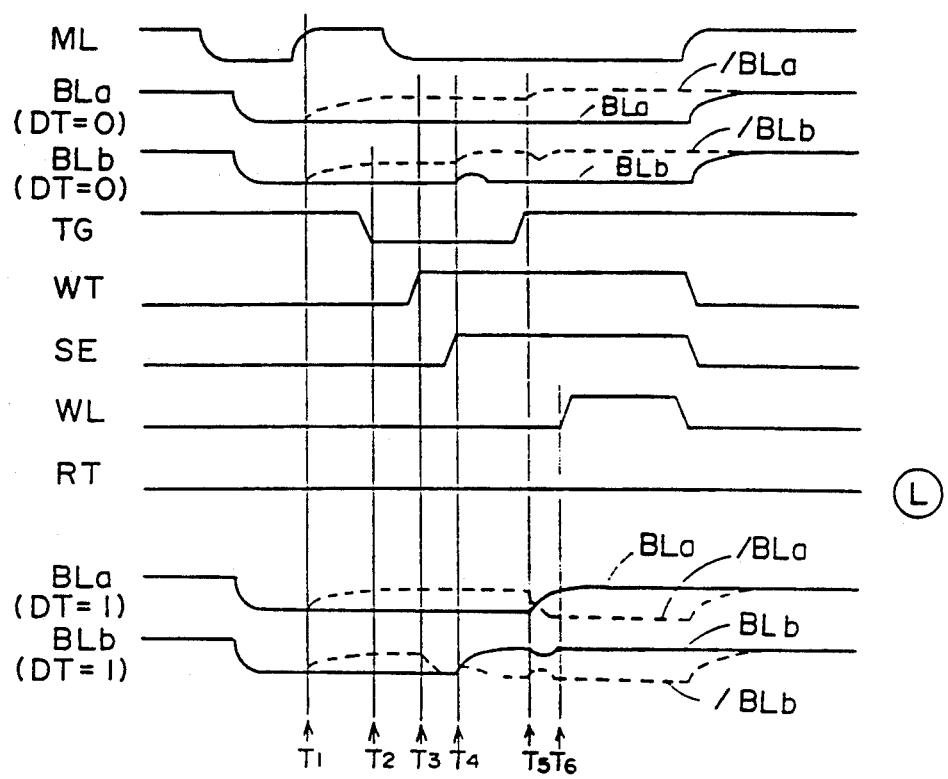
FIG. 9 is a timing chart for explaining a write operation of the bit line control circuit shown in FIG. 8.

Referring to FIG. 9, in the write operation, the transfer gate control signal TG attains a low level in a period between times T2 and T5. In the other time periods, since the control signal TG is at a high level, the bit line control circuit shown in FIG. 8 is electrically equivalent to that shown in FIG. 3 in the other time periods. As shown in FIG. 9, after the electrical charge stored in the CAM cell at time T1 is applied onto the bit line pair BLa, /BLa, the control signal TG attains a low level at time T2. Since the transfer gate circuit 17 is turned off, the sense amplifier 14 is electrically separated from the bit lines BLa, /BLa connected to the CAM cell array. After the sense amplifier 14 is activated at time T4, the control signal TG is caused to rise at time T5. Therefore, a signal fully amplified by the sense amplifier 14 is transmitted to the bit lines BLa, /BLa connected to the CAM cell array through the transfer gate circuit 17.

Figure 10:
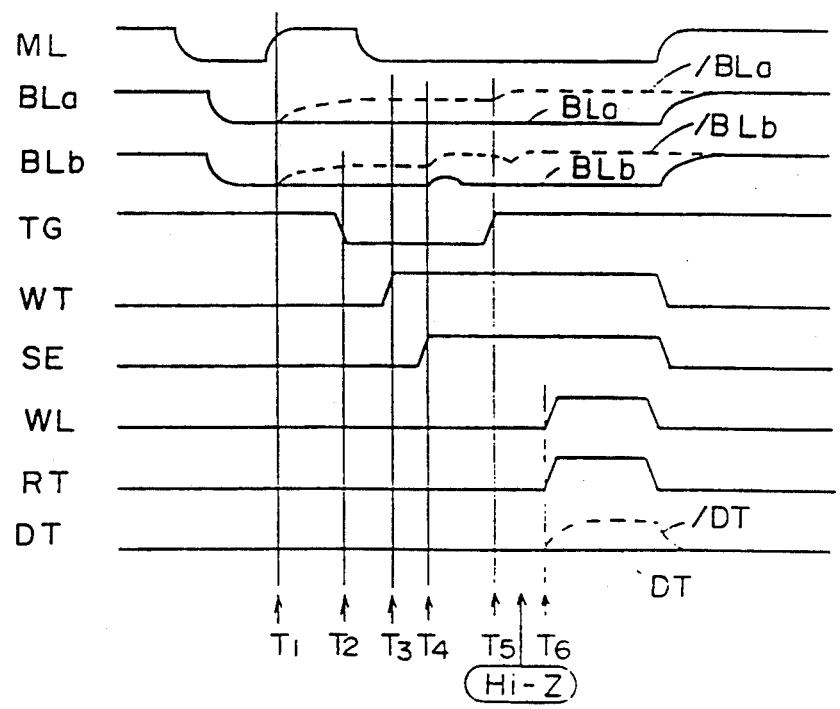
FIG. 10 is a timing chart for explaining a read operation of the bit line control circuit shown in FIG. 8.
Figure 11:
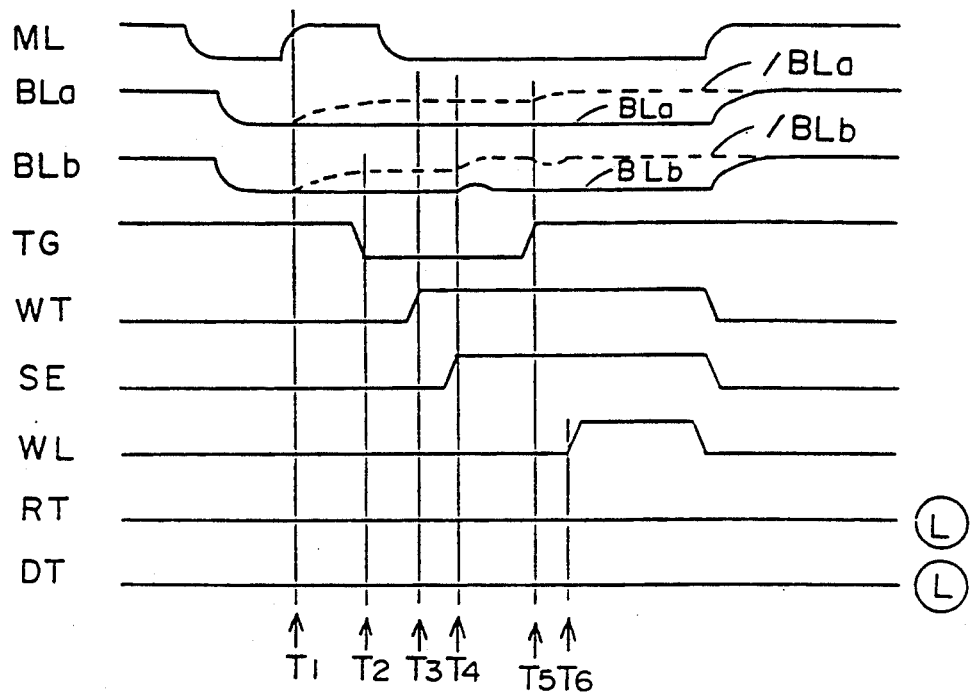
FIG. 11 is a timing chart for explaining a refresh operation of the bit line control circuit shown in FIG. 8.

Also in the read operation shown in FIG. 10 and the refresh operation shown in FIG. 11, the control signal TG is caused to fall and rise at the same timings T2 and T5 as those in the write operation shown in FIG. 9. Therefore, also in these operations, a high speed amplification by the sense amplifier 14 can be obtained.

Figure 12:
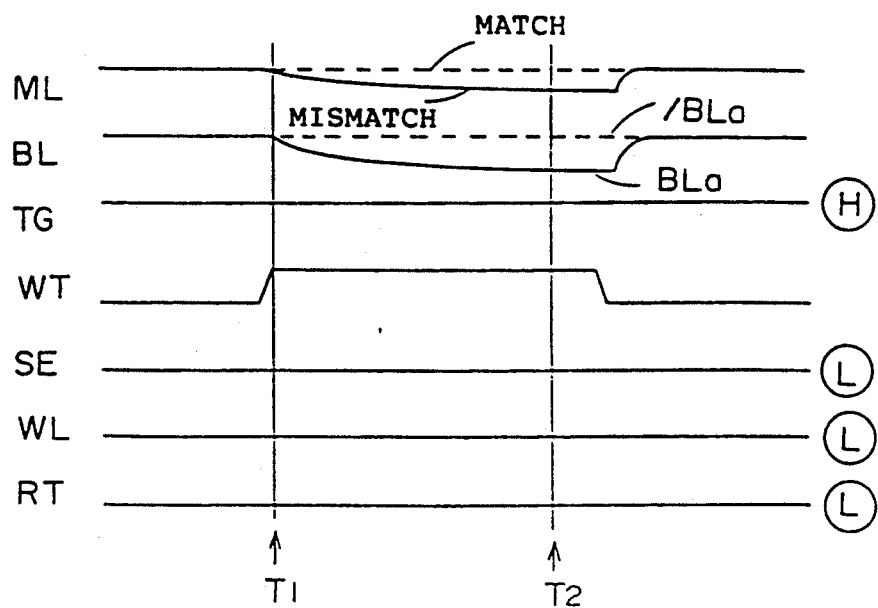
FIG. 12 is a timing chart for explaining a match detecting operation of the bit line control circuit shown in FIG. 8.

In the match detecting operation, as shown in FIG. 12, the control signal TG is retained at a high level. Therefore, the transfer gate circuit 17 continues to be conductive, and substantially the same operation as the match detecting operation shown in FIG. 7 is carried out.

Figure 13:
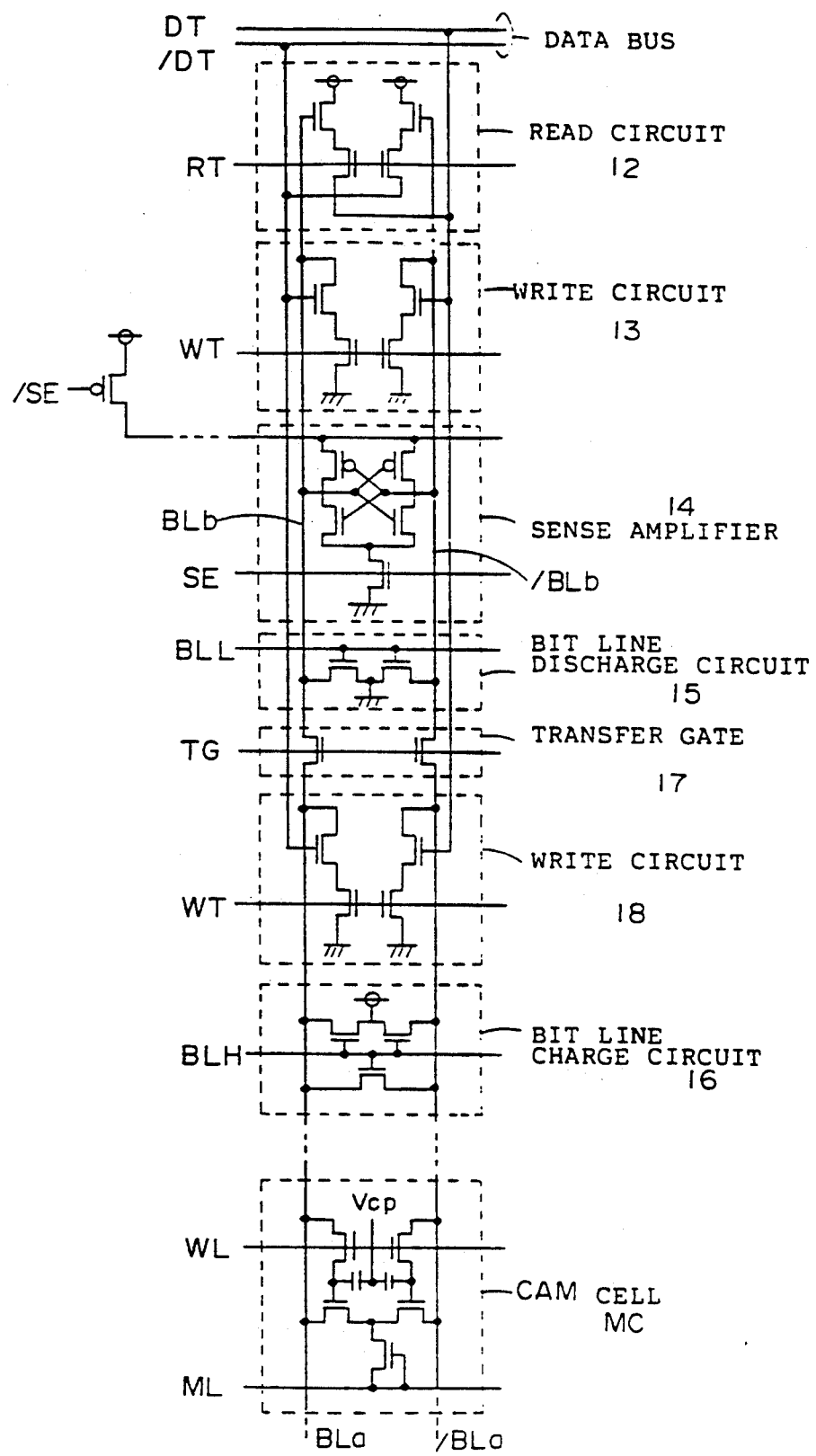
FIG. 13 is a schematic diagram of a bit line control circuit showing still another embodiment of the present invention.

FIG. 13 is a schematic diagram of a bit line control circuit showing still another embodiment of the present invention. Compared to that shown in FIG. 8 (the second embodiment), the bit line control circuit shown in FIG. 13 further includes a second write circuit 18 on the bit lines BLa, /BLa between the transfer gate circuit 17 and the bit line charge circuit 16. The first and the second write circuits 13 and 18 are enabled in response to the commonly applied write enable signal WT. By additionally providing the second write circuit 18, a retrieval data signal applied from the data line pair DT, /DT can be rapidly transmitted to the bit lines BLa, /BLa of the CAM cell array in the match detecting operation. In other words, in the match detecting operation, since the retrieval data signal can be transmitted to the bit lines BLa, /BLa of the CAM cell array without going through the transfer gate circuit 17, the match detecting operation in the CAM cell array may be started earlier than the case shown in FIG. 8.

Figure 14:
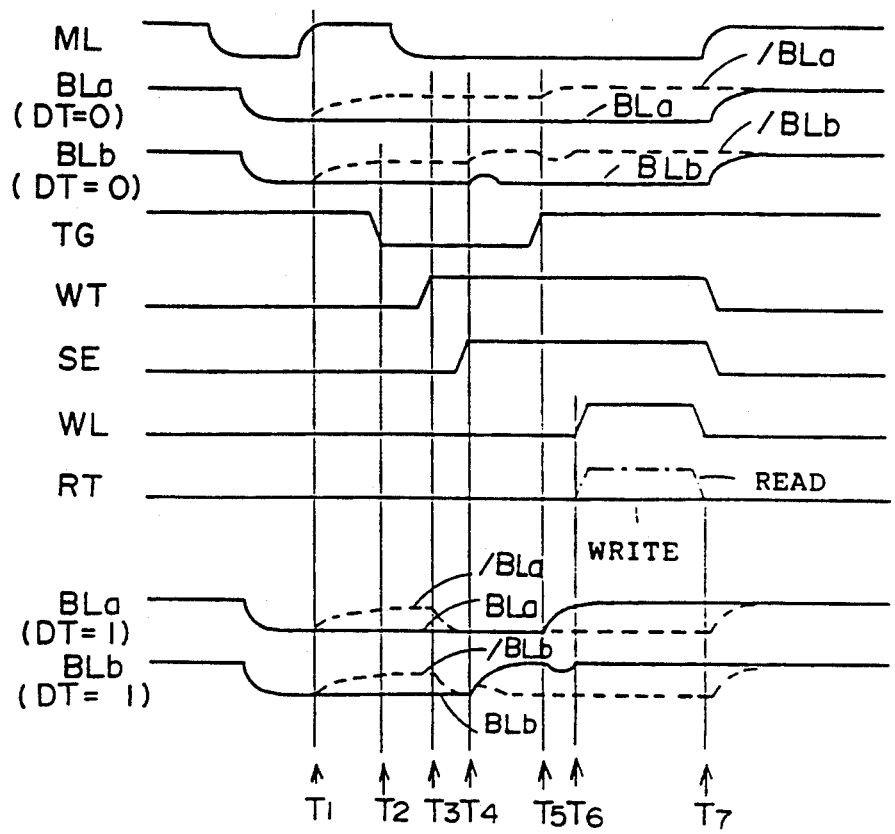
FIG. 14 is a timing chart for explaining write and read operations of the bit line control circuit shown in FIG. 13.

FIG. 14 is a timing chart for explaining the write operation and the read operation of the bit line control circuit shown in FIG. 13. Both of the write operation and the read operation can be explained by the timing chart shown in FIG. 14. A write enable signal RT is continually retained at a low level in the write operation, while it attains a high level in a period between times T6 and T7 in the read operation. The other timing control is the same in the write operation and the read operation. However, since the second write circuit 18 is additionally provided, the manner of potential change in the bit line is different.

The refresh operation and the match detecting operation by the bit line control circuit shown in FIG. 13 can be explained by timing charts shown in FIGS. 11 and 12, respectively. As has been already pointed out, since the second write circuit 18 is additionally provided i the bit line control circuit shown in FIG. 13, the retrieval data signal applied from the data lines DT, /DT can be transmitted to the bit lines BLa, /BLa connected to the CAM cell array at a higher speed.

As can be seen from comparison of all the timing charts described above, the write, the read, and the refresh operations for the dynamic CAM can be carried out under substantially the same timing control even when any bit line control circuit shown in FIGS. 3, 8 or 13 is used. The match detecting operation can also be carried out under the simplified timing control. In other words, by using the bit line control circuit shown in FIGS. 3, 8 or 13, a necessary operation in a dynamic CAM which may be expected to require complicate control in general can be implemented by an extremely simple timing control (that is, substantially the same timing control) and a simplified circuit.

The following description will be given of a redundancy circuit configuration in a dynamic CAM using the bit line control circuit shown in FIGS. 8 and 13.

Figure 16:
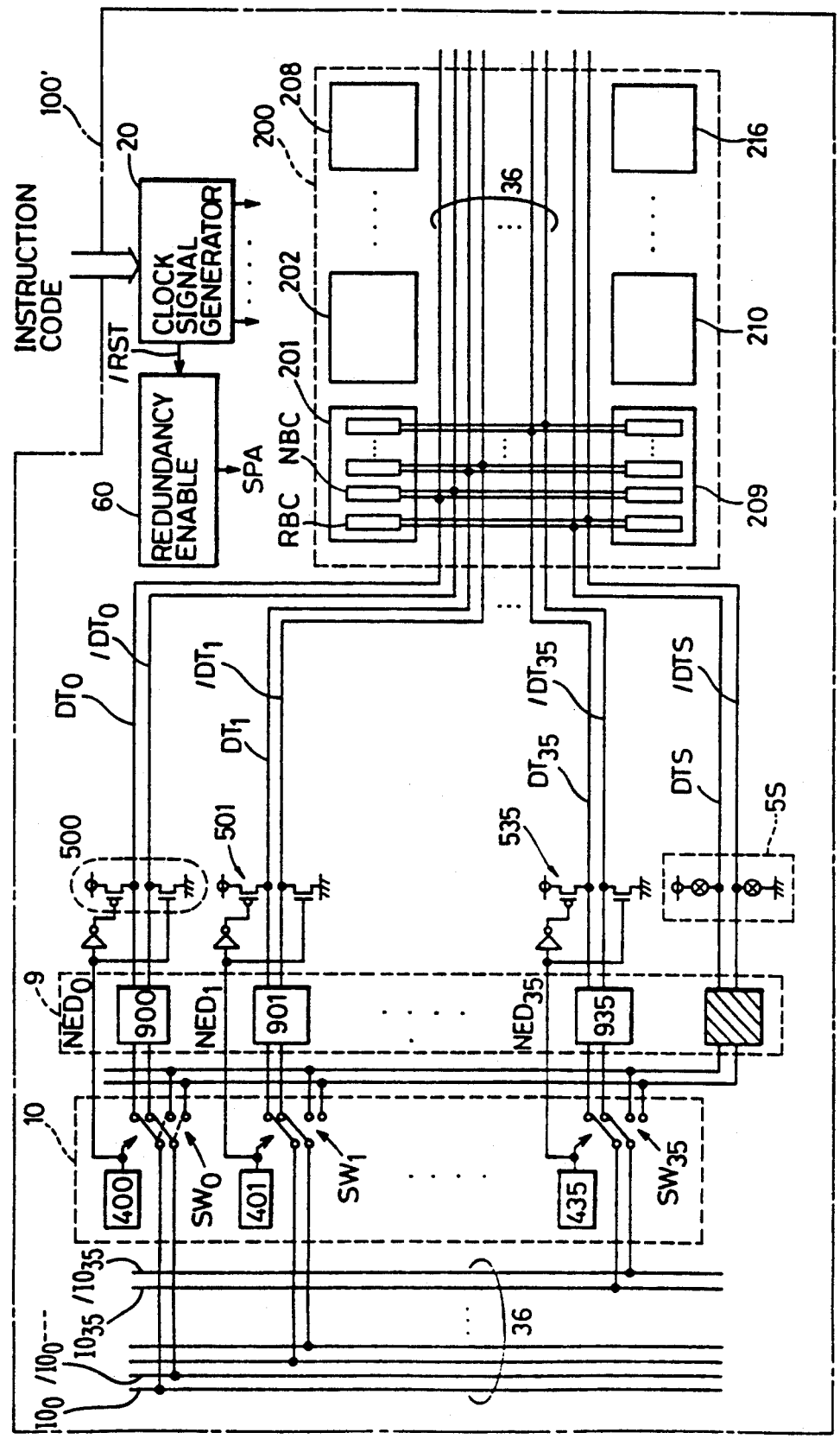
FIG. 16 is a circuit block diagram of a dynamic CAM showing a further embodiment of the present invention.

FIG. 16 is a circuit block diagram of a dynamic CAM showing a further embodiment of the present invention. Referring to FIG. 16, a dynamic CAM 100' includes a CAM array circuit 200 having 16 CAM blocks 201 to 216 in total. Each of the CAM blocks 201 to 216 includes 36 normal bit line circuits NBC and a redundancy bit line circuit RBC. Each normal bit line circuit NBC is connected to a corresponding one of data line pairs DT0, /DT0 to DT35, /DT35. The redundancy bit line circuit RBC is connected to a spare data line pair DTS, /DTS.

The dynamic CAM 100' further includes a switch circuit 10 connected to IO line pairs IO0, /IO0 to IO35, /IO35, the data driver/amplifier circuit 9 connected to the switch circuit 10, data line potential fixed circuits 500 to 535 and 5S, a redundancy enable circuit 60, and a clock signal generator 20. The switch circuit 10 includes switching circuits SW0 to SW35 each connected to a corresponding one of IO line pairs IO0, /IO0 to IO35, /IO35, and defect line program circuits 400 to 435. Each of the switching circuits SW0 to SW35 selects a normal line or a redundancy line in response to program signals NED0 to NED35 applied from the corresponding defect line program circuits 400 to 435.

The data line potential fixed circuits 500 to 535 for a normal line are also operated respectively in response to the program signals NED0 to NED35 applied from the defect line program circuits 400 to 435. For example, when a defect exists in a circuit related to the data lines DT0, /DT0, the high level program signal NED0 is provided by programming in the defect line program circuit 400. Since a PMOS transistor and an NMOS transistor provided in the data line potential fixed circuit 500 is turned on in response to the high level signal NED0, the lines DT0 and /DT0 are brought to a high level and a low level, respectively. In other words, the potential of the data lines DT0, /DT0 of the line having a defect is fixed. On the other hand, in response to the high level signal NED0, the switching circuit SW0 is connected to the side of a data driver/amplifier circuit 9S for redundancy use.

When the redundancy line is not used, two fuses in a data line potential fixed circuit 5S for redundancy use are connected between a power supply potential and a data line DTS and between a ground potential and a data line /DTS, respectively. Therefore, when the redundancy line is not used, the data lines DTS and /DTS are fixed to the power supply potential and the ground potential, respectively. On the other hand, when the redundancy line is used, the two fuses in the data line potential fixed circuit 5S for redundancy use are disconnected. As a result, potential fixation of the data line pair DTS, /DTS is removed, whereby the data line pair DTS, /DTS is activated by the data driver/amplifier circuit 9S for redundancy use.

The redundancy enable circuit 60 generates a high level redundancy enable signal SPA when a defect line exists, in other words, when the redundancy line is used. The clock signal generator 20 decodes an externally applied instruction code to generate various timing control signals necessary in operations in the CAM array circuit described hereinafter.

Each of data driver/amplifier circuits 900 to 935, in a data writing operation, amplifies data signals applied from the corresponding IO line pairs IO0, /IO0 to IO35, /IO35 to apply the amplified signals to the data line pairs DT0, /DT0 to DT35, /DT35. On the other hand, each of data driver/amplifier circuits 900 to 935, in a data reading operation, amplifies data signals on the corresponding data line pairs DT0, /DT0 to DT35, /DT35 to transfer the amplified signals to the corresponding IO line pairs.

Figure 17:
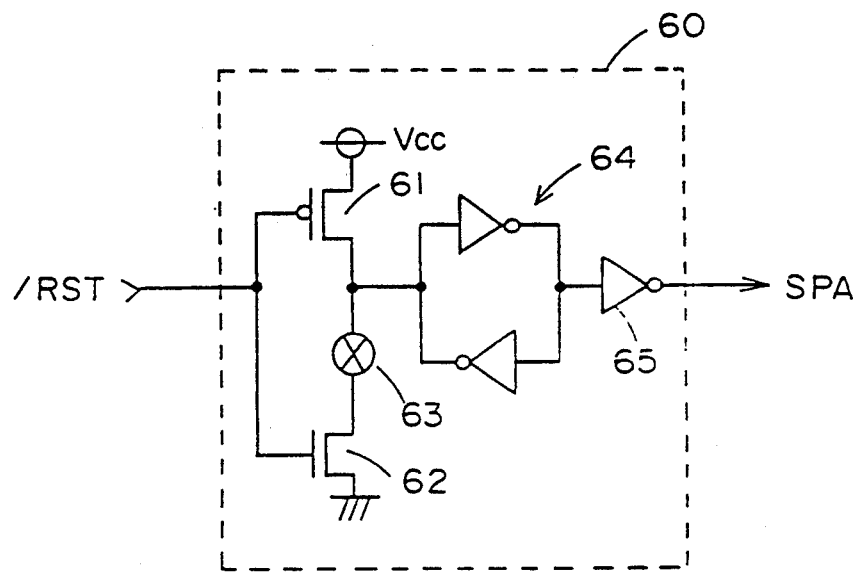
FIG. 17 is a schematic diagram of a redundancy enable circuit shown in FIG. 16.

FIG. 17 is a schematic diagram of the redundancy enable circuit 60 shown in FIG. 16. Referring to FIG. 17, the redundancy enable circuit 60 includes a PMOS transistor 61 and an NMOS transistor 62 configuring a CMOS inverter, a fuse 63 for programming connected between the transistors 61 and 62, a latch circuit 64, and an inverter 65. The gates of the transistors 61 and 62 are connected to receive a reset signal /RST applied from the clock signal generator 20 shown in FIG. 16. The redundancy enable signal SPA is provided through the inverter 65.

Figure 18:
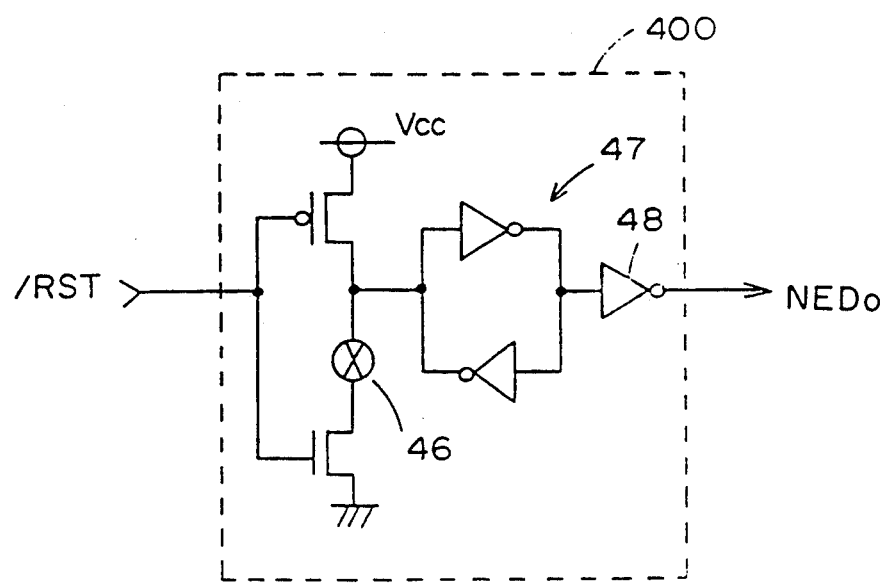
FIG. 18 is a schematic diagram of a defect line program circuit shown in FIG. 16.

FIG. 18 is a schematic diagram of a defect line program circuit (400 as an example) shown in FIG. 16. The redundancy line program circuit 400 also has the same circuit configuration as the redundancy enable circuit 60. The program signal NED0 is provided through an inverter 48.

Figure 15:
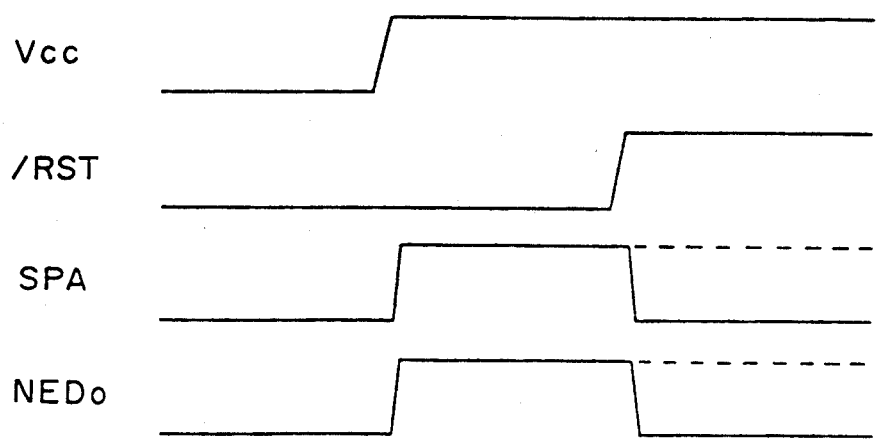
FIG. 15 is a timing chart for explaining operations of a redundancy enable circuit and a defect line program circuit shown in FIGS. 17 and 18.

FIG. 15 is a timing chart for explaining operations of the redundancy enable circuit 60 and the defect line program circuit 400 shown in FIGS. 17 and 18. Referring to FIG. 15, the operations will now be described. When a defect does not exist in any of circuits related to the data line pairs DT0, /DT0 to DT35, /DT35, in other words, when a redundancy circuit is not used, the fuse 63 in the redundancy enable circuit 60 is left connected. Therefore, since the transistors 61 and 62 operate as CMOS inverters, the redundancy enable circuit 60 provides the redundancy enable signal SPA shown by a solid line in FIG. 15 in response to rise of the power supply potential Vcc and the reset signal /RST. Conversely, when the redundancy circuit is used, the fuse 63 is disconnected. Therefore, the redundancy enable circuit 60 provides the signal SPA indicated by a dotted line in FIG. 15 without responding to the reset signal /RST.

On the other hand, the defect line program circuit 400 shown in FIG. 18 operates in the same manner. When a defect does not exist in a circuit related to the data line pair DT0, /DT0, a fuse 46 is left connected. Therefore, the defect line program circuit 400 provides the program signal NED0 shown in FIG. 15 in response to rise of the power supply potential Vcc and the reset signal /RST. Conversely, when a defect exists in the circuit related to the data lines DT0, /DT0, the fuse 46 is disconnected. Therefore, the defect line program circuit 400 provides the program signal NED0 indicated by a dashed line in FIG. 15 without responding to the reset signal /RST.

Figure 19:
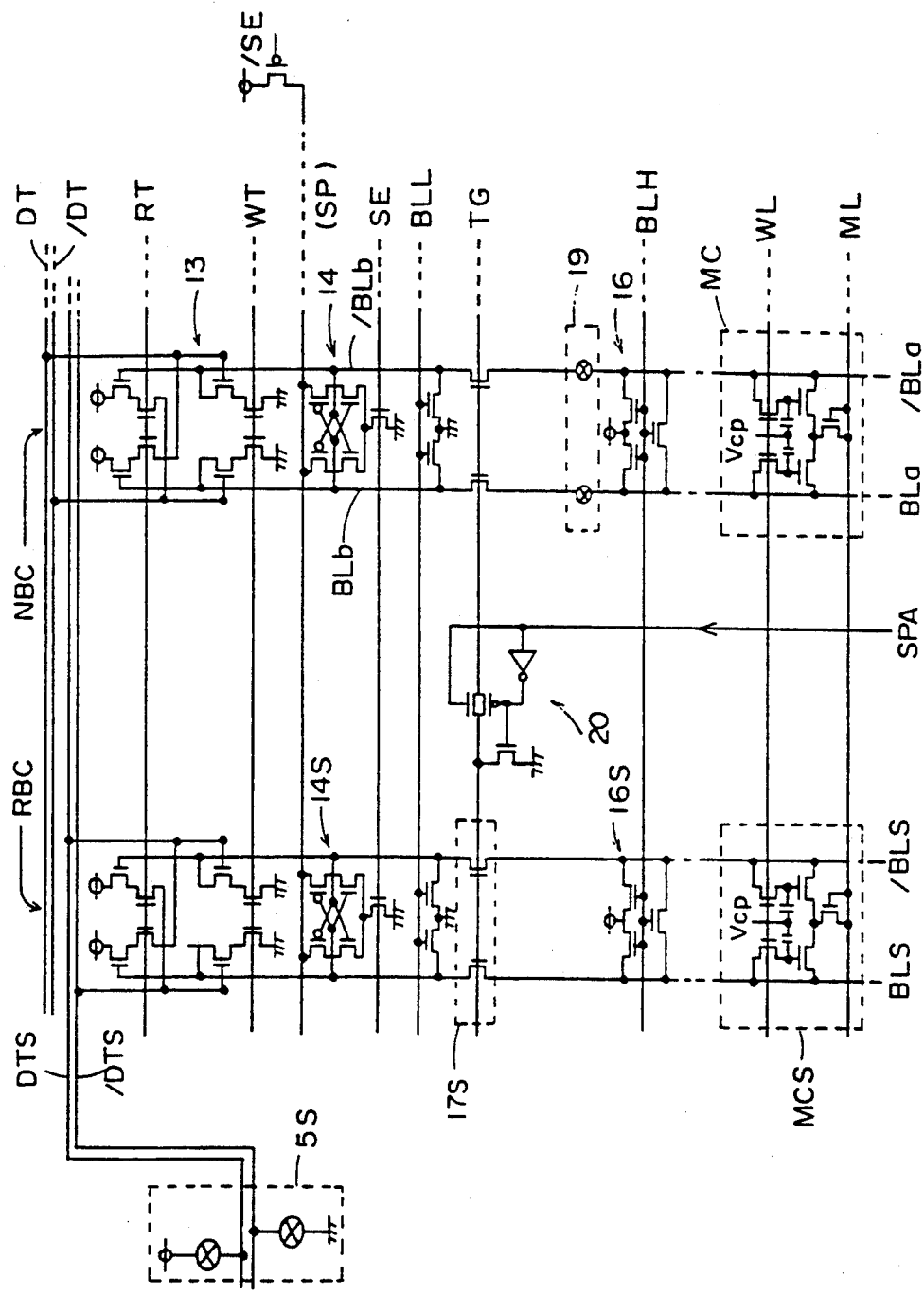
FIG. 19 is a schematic diagram of a normal bit line circuit and a redundancy bit line circuit shown in FIG. 16.

FIG. 19 is a schematic diagram of a normal bit line circuit NBC and a redundancy bit line circuit RBC shown in FIG. 16. Referring to FIG. 19, the normal bit line circuit NBC uses the bit line control circuit shown in FIG. 8 (the second embodiment). The bit line control circuit shown in FIG. 19 further includes two fuses 19 provided on the bit lines BLa, /BLa, respectively. The normal bit line circuit NBC is connected to the corresponding data line pair DT, /DT.

Although the redundancy bit line circuit RBC also uses the bit line control circuit shown in FIG. 8, a switching circuit 20 is further provided for additionally controlling a transfer gate circuit 17S. When the redundancy circuit is not used, a low level redundancy enable signal SPA is applied. The switching circuit 20 is turned off in response to the signal SPA, and provides a low level control signal to the transfer gate circuit 17S. Therefore, since the transfer gate circuit 17S is turned off, the bit line pair BLS, /BLS connected to the CAM cell array is always maintained at a low level (the power supply potential). Conversely, when the redundancy circuit is used, the high level redundancy enable signal SPA is applied. Since the switching circuit 20 is turned on in response to the signal SPA, the transfer gate control signal TG is applied to the transfer gate circuit 17S through the switching circuit 20.

When the redundancy circuit is not used, a data line potential fixed circuit 5S for redundancy use fixes the redundancy data lines DTS, /DTS to the power supply potential Vcc and the ground potential, respectively. On the other hand, when the redundancy circuit is used, two fuses in the circuit 5S are disconnected, and fixation of the potential of the redundancy data lines DTS, /DTS is released.

When the two fuses 19 in the normal bit line circuit NBC are disconnected, the bit line pair BLa, /BLa connected to the side of the CAM cell array are always maintained at a high level (the power supply potential Vcc). Therefore, when the match detecting operation is carried out in the CAM cell array, the normal bit line circuit NBC having a defect is prevented from affecting a retrieval result.

Operations will now be described. When a defect exists in the normal bit line circuit NBC, the redundancy fuse 19 is disconnected. Therefore, in a standby state of the CAM, the voltage level obtained by the activation of the bit line charge circuit 16 is not reduced by the write circuit 13 and the like, whereby the bit line pair BLa, /BLa connected to the side of the CAM cell array is always maintained at a high level (the power supply potential Vcc). Therefore, in the match detecting operation, the match line ML is prevented from being discharged by function of the normal bit line circuit NBC having a defect. In other words, a retrieval result in the CAM cell array is not affected by the normal bit line circuit having a defect.

It should be noted that, since the data line pair DT, /DT to which the normal bit line circuit NBC is connected are fixed to the power supply potential and the ground potential, respectively, by any of the corresponding data line potential fixed circuits 500 to 535 shown in FIG. 16, increase in power consumption caused by repeated activation of the sense amplifier 14 can be prevented.

On the other hand, in the redundancy bit line circuit RBC, when the redundancy circuit is not used, the low level redundancy enable signal SPA is provided. Therefore, since the transfer gate circuit 17S is turned off, the redundancy bit lines BLS, /BLS connected to the CAM cell array is always maintained at the power supply potential by function of the redundancy bit line charge circuit 16S. Therefore, a retrieval result is prevented from being affected by the CAM cell connected to the redundancy bit lines BLS, /BLS.

Similarly to the case of the normal bit line circuit NBC, when the redundancy circuit is not used, the redundancy data lines DTS, /DTS are fixed to the power supply potential and the ground potential, respectively, by function of the redundancy data line potential fixed circuit 5S. Therefore, increase in power consumption caused by repeated activation of a sense amplifier 14S for redundancy use can be prevented.

When the redundancy circuit is used, the transfer gate circuit 17S is turned on since the high level redundancy enable signal SPA is applied. Therefore, the redundancy bit line circuit RBC can carry out normal operations in place of the normal bit line circuit having a defect. In other words, the normal bit line circuit having a defect is equivalently replaced with the redundancy bit line circuit RBC.

Figure 20:
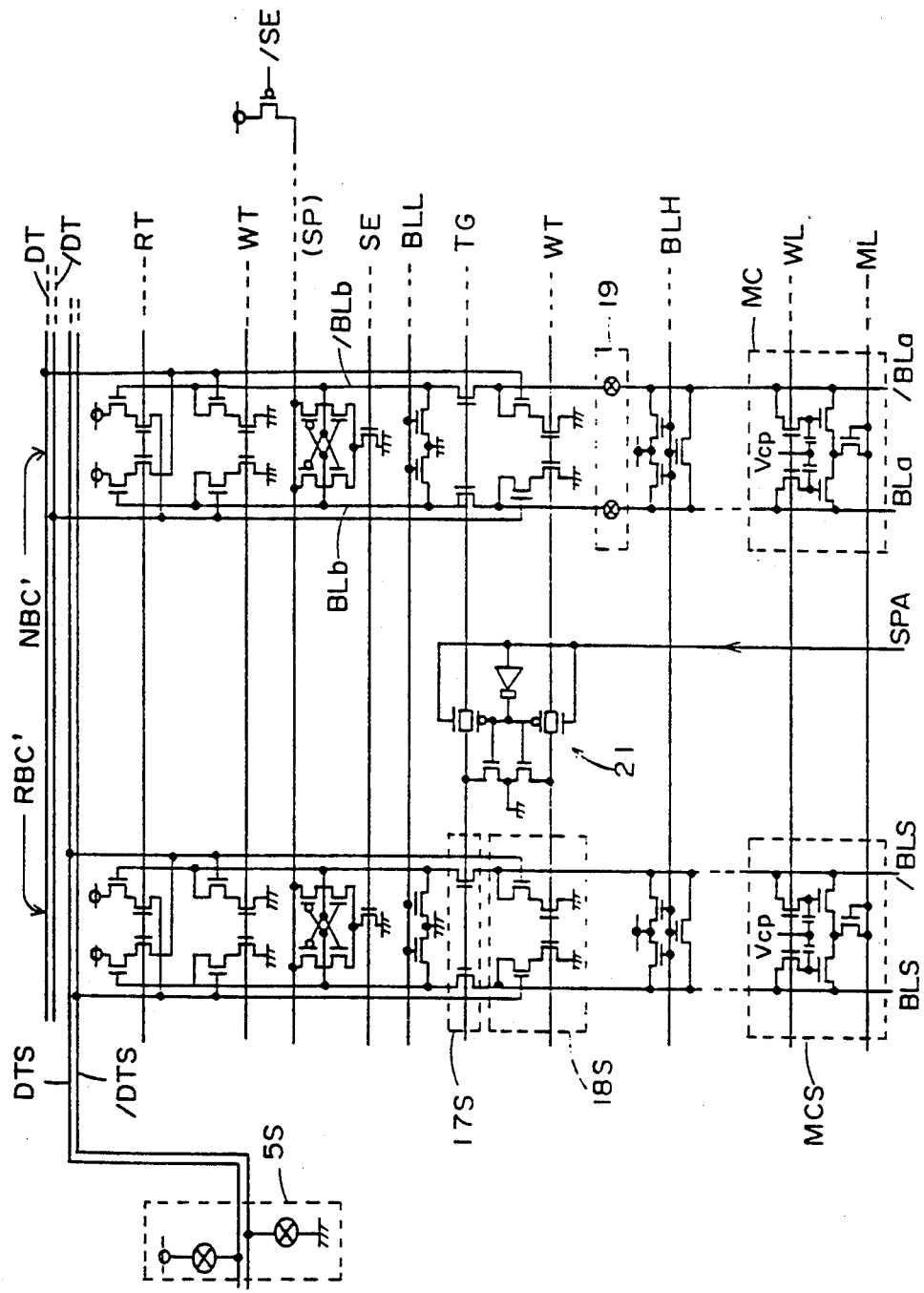
FIG. 20 is a schematic diagram of a normal bit line circuit and a redundancy bit line circuit showing a further embodiment of the present invention.

FIG. 20 is a schematic diagram of a normal bit line circuit NBC' and a redundancy bit line circuit RBC, showing a further embodiment of the present invention. Referring to FIG. 20, the normal bit line circuit NBC' and the redundancy bit line circuit RBC' use the bit line control circuit shown in FIG. 13 (the third embodiment). In addition to the bit line control circuit shown in FIG. 13, the normal bit line circuit NBC' includes the fuse 19 provided on the bit lines BLa, /BLa. On the other hand, the redundancy bit line circuit RBC' further includes a switching circuit 21 operating in response to the redundancy enable signal SPA. The switching circuit 21 provides the redundancy transfer gates circuit 17S and a second redundancy write circuit 18S with the transfer gate control signal TG and the write enable signal WT, respectively, when the high level redundancy enable signal SPA is applied. Since the basic operations in a circuit shown in FIG. 20 are the same as those in the circuit shown in FIG. 19, description will not be repeated.

Figure 21:
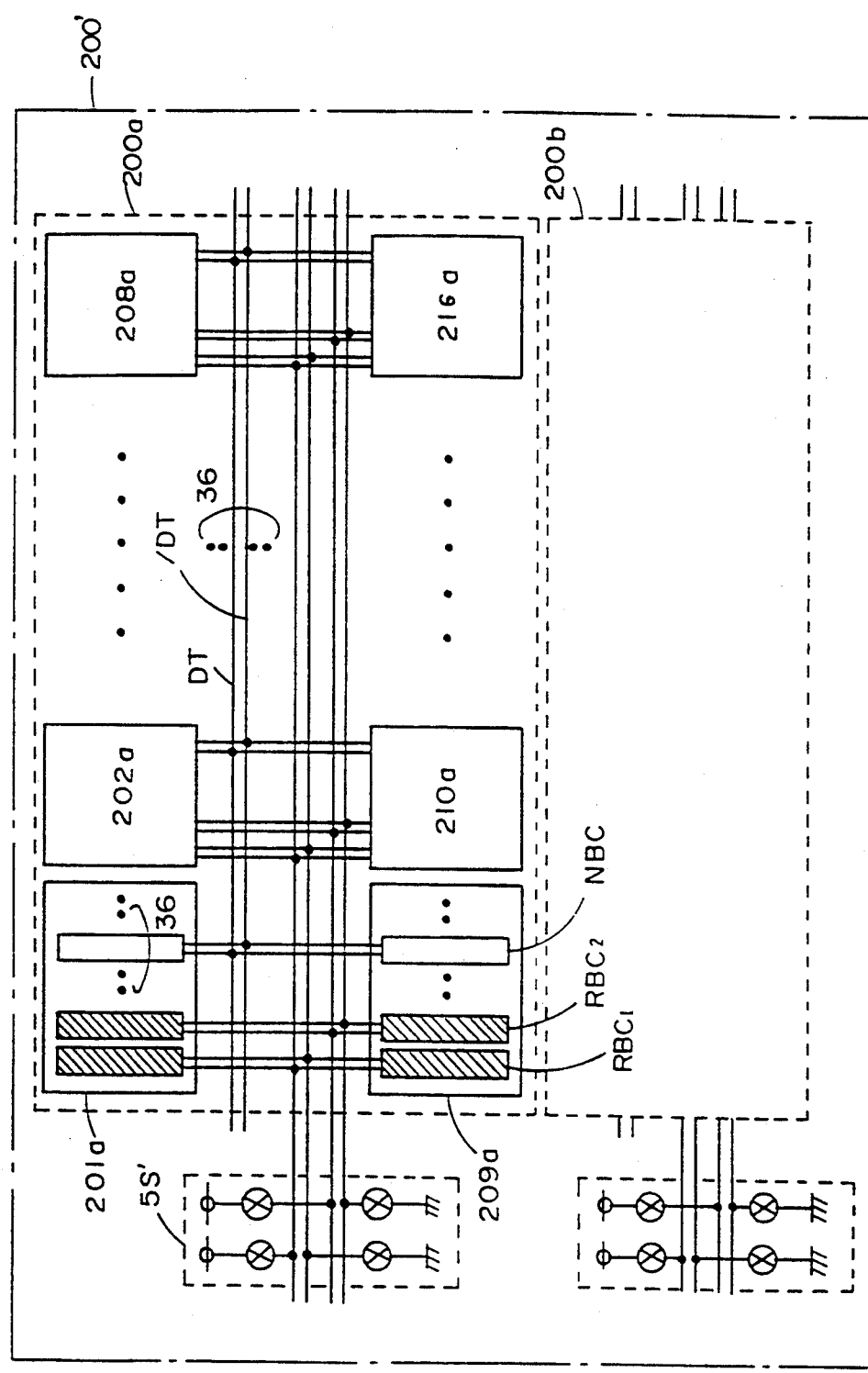
FIG. 21 is a block diagram of a CAM array circuit showing a further embodiment of the present invention.
Figure 24A:
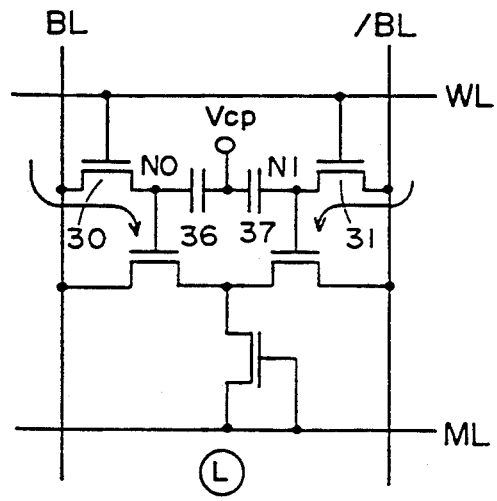
FIGS. 24A and 24B are schematic diagrams of circuits for explaining read and write operations in a dynamic CAM cell.
Figure 24B:
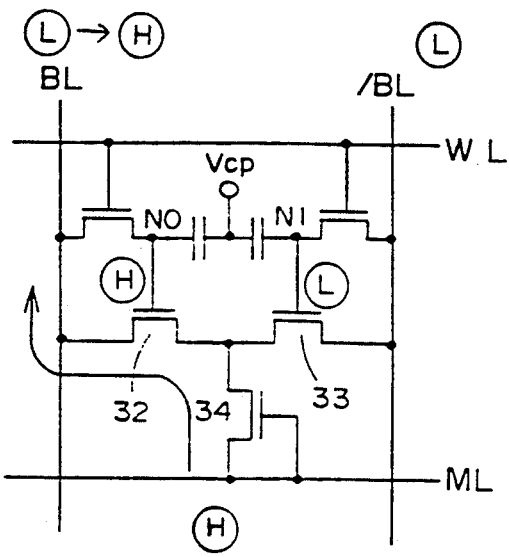

FIG. 21 is a block diagram of a CAM array circuit showing a further embodiment of the present invention. The CAM array circuit 200 shown in FIG. 16 included the CAM blocks 201 to 216 each having 36 normal bit line circuits NBC and a redundancy bit line circuit RBC. A CAM array circuit 200a shown in FIG. 21 includes CAM blocks 201a to 216a each having 36 normal bit line circuits NBC and two redundancy bit line circuits RBC1, RBC2. Since a CAM array circuit 200b having the same circuit configuration as the CAM array circuit 200a is provided, the CAM array circuit 200' is meant to include 32 CAM blocks in total.

Since each CAM block, for example, 209a includes two redundancy bit line circuits RBC1 and RBC2, a redundancy data line potential fixed circuit 5S' includes four fuses for fixing two redundancy data line pairs connected to the redundancy bit line circuits RBC1 and RBC2. Since the basic operations in the CAM array circuit 200' shown in FIG. 21 are the same as those in the CAM array circuit 200 shown in FIG. 16, description will not be repeated.

As described above, by using the bit line control circuit shown in FIGS. 3, 8 and 13, necessary operation in a dynamic CAM which may be expected to require complicated control in general can be implemented by an extremely simple circuit and by simple timing control. Furthermore, by using these bit line control circuits in a manner shown, for example, in FIGS. 19 and 20, a useful redundancy circuit for a dynamic CAM can be implemented. As a result, a dynamic CAM necessary to carry out retrieval of a large amount of data can be provided in due consideration of improvement of the yield rate in production.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic content addressable memory device, comprising:
   a memory cell array including a plurality of dynamic associative memory cells arranged in rows and columns;
   a plurality of bit line pairs each connected to said associative memory cells in a corresponding column;
   a plurality of data line pairs each connected to a corresponding one of said plurality of bit line pairs;
   a plurality of word lines each connected to said associative memory cells in a corresponding row;
   a plurality of match detecting lines each connected to said associative memory cells in a corresponding row;
   a plurality of first bit line pair driving means each connected to a corresponding bit line pair and responsive to a signal on a corresponding data line pair for driving said corresponding bit line pair;
   a plurality of sense amplifier means each connected to a corresponding bit line pair and responsive to a sense amplifier activating signal for amplifying a data signal on said corresponding bit line pair; and
   a plurality of data line pair driving means each connected to a corresponding data line pair and responsive to a signal on a corresponding bit line pair for driving said corresponding data line pair.

2. The dynamic content addressable memory device according to claim 1, wherein each said associative memory cell comprises:
   capacitor means for storing a data signal;
   data writing means responsive to a signal on a corresponding word line for providing a data signal on a corresponding bit line pair to said capacitor means; and
   data reading means responsive to activation of a corresponding match detecting line for providing the data signal stored by said capacitor means to said corresponding bit line pair.

3. The dynamic content addressable memory device according to claim 1, wherein said plurality of first bit line driving means include a plurality of bit line pull down means each connected to a corresponding bit line pair and responsive to a signal on a corresponding data line pair for selectively pulling down a line of said corresponding bit line pair.

4. The dynamic content addressable memory device according to claim 1, wherein said plurality of data line driving means include a plurality of data line pull up means each connected to a corresponding bit line pair and responsive to a signal on said corresponding bit line pair for selectively pulling up a line of said corresponding data line pair.

5. The dynamic content addressable memory device according to claim 1, further comprising disconnecting means responsive to a switching control signal applied prior to activation of said plurality of sense amplifier means for electrically disconnecting said memory cell array from said plurality of sense amplifier means.

6. The dynamic content addressable memory device according to claim 5, wherein
said disconnecting means is connected between said plurality of sense amplifier means and said memory cell array, and
said memory device further includes a plurality of second bit line pair driving means each connected between said disconnecting means and said memory cell array and responsive to a signal on a corresponding data line pair for driving a corresponding bit line pair.

7. The content addressable memory device according to claim 1, further comprising disable means responsive to an externally applied operation mode control signal for disabling said first bit line pair driving means.

8. The dynamic content addressable memory device according to claim 7, wherein said disable means includes means responsive to the externally applied operation mode control signal for fixing said data line pair to a first predetermined potential.

9. The dynamic content addressable memory device according to claim 7, wherein
said externally applied operation mode control signal is a read instructing signal or a refresh instructing signal, and
said disable means disables said plurality of first bit line pair driving means in response to the read instructing signal or the refresh instructing signal.

10. The dynamic content addressable memory device according to claim 7, wherein
said externally applied operation mode control signal is a partial write instructing signal, and
said disable means includes partial disable means responsive to the partial write instructing signal for partially disabling said plurality of first bit line pair driving means.

11. A method of data writing operation in the dynamic content addressable memory device recited in claim 1, comprising the steps of:
providing said plurality of data line pairs with data signals to be written in said memory cell array;
activating said plurality of first bit line pair driving means;
activating said plurality of sense amplifier means to amplify said data signals; and
selectively activating one of said plurality of word lines to write said amplified data signals into said memory cell array.

12. A method of data reading operation in the dynamic content addressable memory device recited in claim 1, comprising the steps of:
bringing said plurality of data line pairs to a predetermined potential;
activating said match detecting lines, the associative memory cells connected to the activated match detecting lines providing stored data signals to said plurality of bit line pairs;
activating said sense amplifier means in response to the sense amplifier activating signal; and
activating said plurality of data line pair driving means.

13. A method of data refresh operation in the dynamic content addressable memory device recited in claim 1, comprising the steps of;
bringing said plurality of data line pairs to a predetermined potential;
activating said match detecting lines, the associative memory cells connected to the activated match detecting lines providing stored data signals to said plurality of bit line pairs;
activating said sense amplifier means to amplify the data signals provided on said bit line pairs; and
selectively activating one of said plurality of word lines to write the amplified data signals into the corresponding associative memory cells.

14. A method of data retrieving operation in the dynamic content addressable memory device recited in claim 1, comprising the steps of:
bringing said match detecting line to a predetermined potential;
providing retrieval data signals to said plurality of data line pairs;
activating said plurality of first bit line pair driving means; and
detecting a potential change of said match detecting line.

15. A method of partially masked data retrieving operation in the dynamic content addressable memory device recited in claim 1, comprising the steps of:
bringing said match detecting lines to a first predetermined potential;
bringing a pair of said plurality of data line pairs corresponding to masked data to a second predetermined potential;
providing a retrieval data signal to a pair of said plurality of data line pairs corresponding to non-masked data;
activating said plurality of first bit line pair driving means; and
detecting a potential change on said match detecting lines to detect a match between the retrieval data signal and data stored in the memory cell array.

16. A dynamic content addressable memory device, comprising:
a plurality of associative memory cells arranged in rows and columns;
a plurality of bit line pairs each connected to said associative memory cells in a corresponding column;
a plurality of match detecting lines each connected to said associative memory cells in a corresponding row;
a plurality of bit line pair driving means each connected to a corresponding bit line pair and responsive to a comparison data signal applied through a corresponding data signal applied through a corresponding data line pair for driving said corresponding bit line pair; and
match detecting line charge means for charging said plurality of match detecting lines to a predetermined potential, wherein
each of said plurality of associative memory cells includes;
capacitor means for storing a data signal, and comparing means coupled to said bit line pairs and match detecting lines for comparing said comparison data signal applied through a corresponding bit line pair with the data signal stored by said capacitor means to change a potential of a corresponding match detecting line.

17. A dynamic content addressable memory device, comprising:
a plurality of associative memory cells arranged in rows and columns;
a plurality of bit line pairs each connected to said associative memory cells in a corresponding column;
a plurality of word lines each connected to said associative memory cells in a corresponding row;
a plurality of match detecting lines each connected to said associative memory cells in a corresponding row;
a plurality of amplifier means each connected to a corresponding bit line pair for amplifying a data signal on said corresponding bit line pair, wherein
each of said plurality of associative memory cells includes;
capacitor means for storing a data signal,
first switching means responsive to a signal on a corresponding word line for providing the data signal on a corresponding bit line pair of said capacitor means, and
second switching means responsive to a signal on a corresponding match detecting line for providing the data signal stored by said capacitor means to said corresponding bit line pair, said dynamic content addressable memory device further comprising:
refresh control means responsive to a refresh instructing signal for activating said match detecting line, said amplifier means and the word line selected by an address signal.

18. A dynamic content addressable memory device, comprising:
a memory cell array including a plurality of dynamic associative memory cells arranged in rows and columns;
a plurality of bit line pairs each connected to said associative memory cells in a corresponding column;
a plurality of data line pairs each connected to a corresponding one of said plurality of bit line pairs;
a plurality of word lines each connected to said associative memory cells in a corresponding row;
a plurality of match detecting lines each connected to associative memory cells in a corresponding row;
a plurality of bit line pair driving means each connected to a corresponding bit line and responsive to a signal on a corresponding data line and responsive to a signal on a corresponding data line pair for driving said corresponding bit line pair;
a plurality of sense amplifier means each connected to a corresponding bit line pair and responsive to a sense amplifier activating signal for amplifying a data signal on said corresponding bit line pair;
a plurality of data line pair driving means each connected to a corresponding bit line pair and responsive to a signal on said corresponding bit line pair for driving a corresponding data line pair,
said plurality of bit line pairs including a predetermined redundancy bit line pair for redundancy use;
redundancy access disable means connected to said redundancy bit line pair for disabling access to associative memory cells connected to said redundancy bit line pair in a normal access state;
a plurality of normal access disable means each connected to a corresponding bit line pair except for said redundancy bit line pair for selectively disabling access to said associative memory cells connected to said corresponding bit line pair when a defect in a circuit associated with said bit line pair is detected; and
redundancy disable releasing means for activating said redundancy access disable means when said defect is detected.

19. The dynamic content addressable memory device according to claim 18, wherein said redundancy access disable means includes:
means including first predetermined fuse means for generating a redundancy access disable signal by leaving said first fuse means connected, and
means responsive to said redundancy access enable signal for electrically disconnecting memory cells connected to said redundancy bit line pair from said sense amplifier means.

20. The dynamic content addressable memory device according to claim 18, wherein said normal access disable means includes:
programming means for programming a response to detecting a defect data line pair of said plurality of data line pairs, and
validating means for setting a redundancy data line in place of said defect data line pair of said plurality of data line pairs in accordance with said programming means.

21. The dynamic content addressable memory device according to claim 20, wherein said normal access disable means further comprises means for physically disconnecting associative memory cells connected to a bit line pair corresponding to said defect data line pair from said sense amplifier means.

* * * * *